(12) United States Patent
Conti et al.

(10) Patent No.: US 10,600,844 B2
(45) Date of Patent: Mar. 24, 2020

(54) MEMORY STRUCTURES HAVING REDUCED VIA RESISTANCE

(71) Applicant: Intel Corporation, Santa Clara, CA (US)

(72) Inventors: Anna Maria Conti, Agrate Brianza (IT); Andrea Redaelli, Casatenovo (IT)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/147,264

(22) Filed: Sep. 28, 2018

(65) Prior Publication Data

US 2019/0043924 A1    Feb. 7, 2019

(51) Int. Cl.
*H01L 27/24* (2006.01)
*H01L 45/00* (2006.01)

(52) U.S. Cl.
CPC ...... *H01L 27/2463* (2013.01); *H01L 27/2427* (2013.01); *H01L 45/065* (2013.01); *H01L 45/16* (2013.01); *H01L 45/06* (2013.01); *H01L 45/1233* (2013.01); *H01L 45/141* (2013.01); *H01L 45/1675* (2013.01)

(58) Field of Classification Search
CPC . H01L 45/06; H01L 45/1233; H01L 45/1253; H01L 27/2409; H01L 27/2418; H01L 27/2427
See application file for complete search history.

(56) References Cited

U.S. PATENT DOCUMENTS

| | | | |
|---|---|---|---|
| 9,595,564 B1 * | 3/2017 | Ikedo | H01L 45/06 |
| 2019/0043923 A1 * | 2/2019 | Ahmed | H01L 27/2463 |
| 2019/0044060 A1 * | 2/2019 | Russell | H01L 45/06 |
| 2019/0140022 A1 * | 5/2019 | Jeong | H01L 27/2481 |

* cited by examiner

*Primary Examiner* — Allison Bernstein
(74) *Attorney, Agent, or Firm* — Thorpe North & Western, LLP; David W. Osborne

(57) ABSTRACT

A memory structure can include a memory cell, a via, a dielectric material separating the memory cell from the via, a metal ceramic composite material layer on the memory cell and the dielectric material, and a conductive layer on the metal ceramic composite material layer and the via. The conductive layer can be in direct contact with the top surface of the via.

20 Claims, 19 Drawing Sheets

MEMORY STRUCTURES HAVING REDUCED VIA RESISTANCE

BACKGROUND

Phase change materials have properties that invite their use in a number of applications such as ovonic threshold switches and phase change memory (PCM). Different physical states of the phase change material have different levels of electrical resistance. For example, one state, such as an amorphous state, can have a high electrical resistance, while another state, such as a crystalline state, can have a low electrical resistance. In PCM, these different levels of electrical resistance can be used to store binary information. Each state is designated a different binary value, and once stored, information can be read by detecting the electrical resistance of the material. The fact that each state persists once fixed makes PCM a valuable non-volatile memory (NVM) type.

DESCRIPTION OF EMBODIMENTS

Figure 1A:
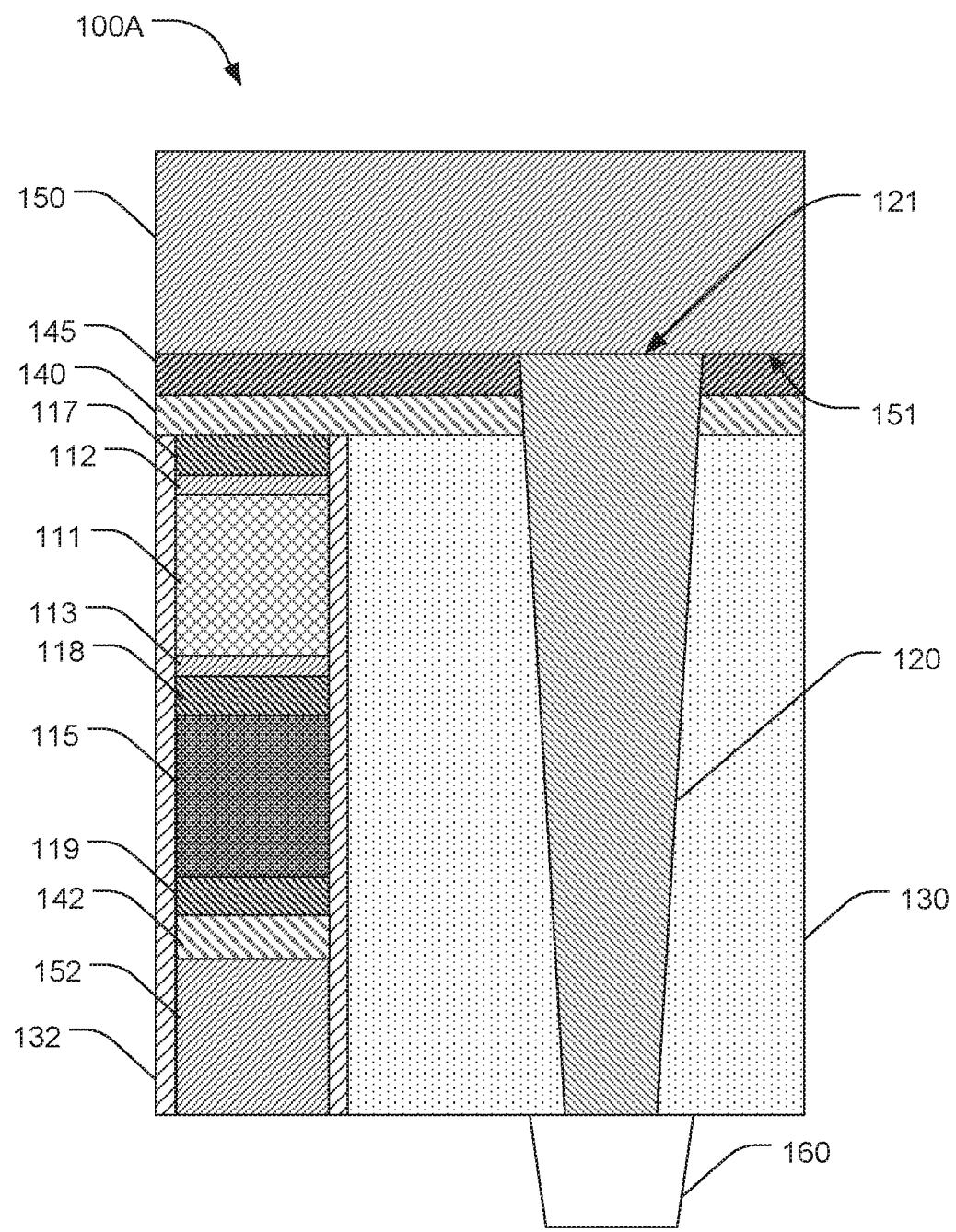
FIG. 1A illustrates a memory structure, in accordance with an example embodiment.

Although the following detailed description contains many specifics for the purpose of illustration, a person of ordinary skill in the art will appreciate that many variations and alterations to the following details can be made and are considered to be included herein. Accordingly, the following embodiments are set forth without any loss of generality to, and without imposing limitations upon, any claims set forth. It is also to be understood that the terminology used herein is for the purpose of describing particular embodiments only, and is not intended to be limiting. Unless defined otherwise, all technical and scientific terms used herein have the same meaning as commonly understood by one of ordinary skill in the art to which this disclosure belongs.

As used in this written description, the singular forms "a," "an" and "the" include express support for plural referents unless the context clearly dictates otherwise and vice versa. Thus, for example, reference to "a memory cell" includes a plurality of such memory cells and reference to "bit lines" includes a single bit line.

In this application, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the compositions nature or characteristics would be permissible if present under the "consisting essentially of" language, even though not expressly recited in a list of items following such terminology. When using an open-ended term, like "comprising" or "including," in this written description it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that any terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein. The term "coupled," as used herein, is defined as directly or indirectly connected in an electrical or nonelectrical manner. Objects described herein as being "adjacent to" each other may be in physical contact with each other, in close proximity to each other, or in the same general region or area as each other, as appropriate for the context in which the phrase is used. Occurrences of the phrase "in one embodiment," or "in one aspect," herein do not necessarily all refer to the same embodiment or aspect.

The term "coupled," as used herein, is defined as directly or indirectly connected in an electrical or nonelectrical manner. "Directly coupled" objects or elements are in physical contact with one another and are attached. Objects described herein as being "adjacent to" each other may be in physical contact with each other, in close proximity to each other, or in the same general region or area as each other, as appropriate for the context in which the phrase is used.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint. Unless otherwise stated, use of the term "about" in accordance with a specific number or numerical range should also be understood to provide support for such numerical terms or range without the term "about". For example, for the sake of convenience and brevity, a numerical range of "about 50 angstroms to about 80 angstroms" should also be understood to provide support for the range of "50 angstroms to 80 angstroms." Furthermore, it is to be understood that in this specification support for actual numerical values is provided even when the term "about" is used therewith. For example, the recitation of "about" 30 should be construed as not only providing support for values a little above and a little below 30, but also for the actual numerical value of 30 as well.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment.

Example Embodiments

An initial overview of technology embodiments is provided below and specific embodiments are then described in further detail. This initial summary is intended to aid readers in understanding the technological concepts more quickly, but is not intended to identify key or essential features thereof, nor is it intended to limit the scope of the claimed subject matter.

Phase change memory devices have been developed to include an array of memory cells connected to bit lines and word lines. In many cases, each phase change memory cell is made up of a number of layers of different materials. Such layers can include a phase change material, electrodes, select device materials, diffusion barrier materials, thermal insulating materials, and so on. In some cases, individual memory cells can be separated by dielectric materials to electrically insulate the memory cells one from another. Bit lines and word lines can be a line of metal or other conductive material deposited along columns and rows of memory cells to allow the memory cells to be individually addressable. Additional structures are sometimes incorporated into the memory array such as conductive vias that penetrate through the substrate on which the memory array is formed.

The various material layers and structures that make up a phase change memory device can present various operational and manufacturing challenges. For example, it can often be desirable to make these structures as small as possible in order to make high-density memory. Further, it can be desirable to maximize operational efficiency of individual memory cells. However, this can be balanced against processing limitations and the need for consistent and reliable memory operation.

In certain types of phase change memory, the memory cells can include at least a phase change material layer and a top electrode layer above the phase change material layer. A metal bitline can be deposited over a column of memory cells, but first a metal ceramic composite material layer can be deposited between the electrode layer and the metal bitline. In some cases, the metal ceramic composite material layer can increase the programming efficiency of the memory cell. However, if the metal ceramic composite material layer is also formed between the bitline and a connecting via, the metal ceramic composite material layer can increase the electrical resistance between the via and the bitline. This can increase energy consumption for read/write operations of the corresponding memory device and limit the maximum delivered current.

The present disclosure describes memory structures, devices, systems, and associated methods that can provide a memory cell with good thermal efficiency, minimized programming current, and good material stability. As a further note, in the present disclosure, it is noted that when discussing the various structures, devices, systems, and methods, each of these discussions can be considered applicable to each of these examples, whether or not they are explicitly discussed in the context of that example. Thus, for example, in discussing details about the memory structures per se, such discussion also refers to the memory devices, computing systems, and methods, and vice versa.

In further detail, memory structures, as described herein, can include a memory cell, a via, a dielectric material separating the memory cell from the via, a metal ceramic composite material layer on the memory cell and the dielectric material, and a conductive layer on the metal ceramic composite material layer and the via. The conductive layer can be in direct contact with the upper or top surface of the via. Some examples of memory structures are illustrated in FIGS. 1A and 1B.

Figure 1B:
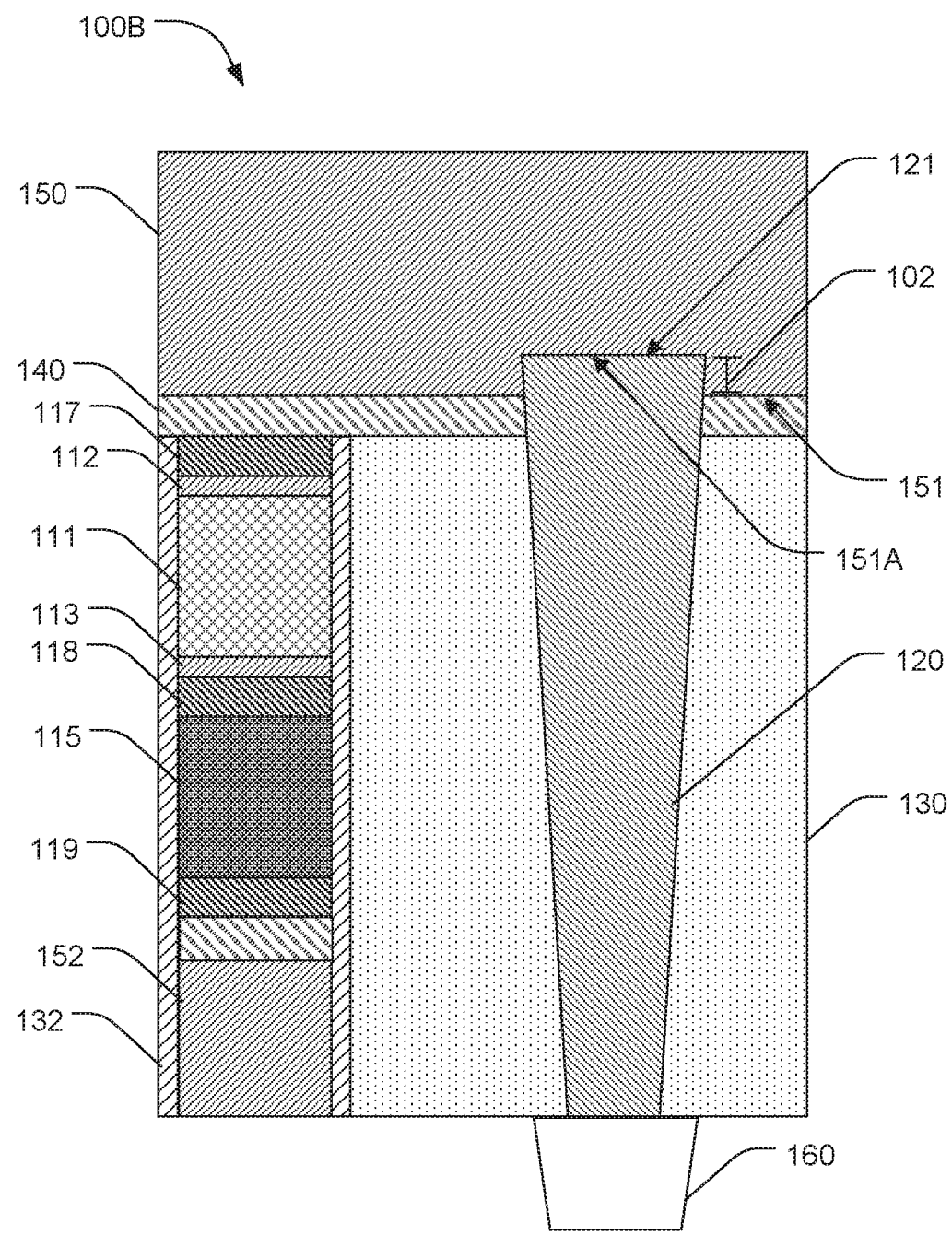
FIG. 1B illustrates a memory structure, in accordance with an example embodiment.

For example, as illustrated in FIG. 1A, memory structure 100A can include a memory cell. In this particular example, the memory cell includes a phase change memory (PCM) material 111, such as a chalcogenide. The PCM material 111 is in direct contact with an upper lamina layer 112 and a lower lamina layer 113. The memory cell also includes a select device layer 115. Further still, the memory cell includes a first electrode 117, a second electrode 118, and a third electrode 119. It is noted that the memory cells described herein will generally be discussed as including these particular layers. However, this is not intended to be limiting as merely for ease and brevity of discussion. Any suitable memory cell can be included in the present structures, devices, systems, and methods.

The memory cell is positioned between a conductive layer 150 (e.g. first conductive layer, upper conductive layer, or bitline) and a second conductive layer 152 (e.g. lower conductive layer or wordline). It is further noted that while conductive layer 150 is generally referred to herein as "a bitline" and second conductive layer is generally referred to herein as "a wordline," this is not intended to be limiting. As will be appreciated by one skilled in the art, in some examples conductive layer 150 can be a wordline and second conductive layer 152 can be a bitline.

A metal ceramic composite material layer (or first metal ceramic composite material layer) 140 is positioned between the memory cell and the conductive layer 150. A second metal ceramic composite material layer 142 is positioned between the memory cell and the conductive layer 152. Further, a barrier layer 145 is positioned between the metal ceramic composite material layer 140 and the conductive layer 150. A via 120 is positioned between the conductive layer 150 and an electrical contact or interconnect 160. The via 120 extends through the metal ceramic composite material layer 140 and the barrier layer 145 to directly contact the conductive layer 150. More specifically, an upper or top surface 121 of the via 120 is in direct contact with a lower or bottom surface 151 of the conductive layer 150. In this particular example, the upper or top surface 121 of the via 120 can be substantially planar with (e.g. within 2 nanometers (nm), within 3 nm, within 5 nm) an upper or top surface of the barrier layer 145. In some examples, the upper or top surface 121 of the via can be substantially level with (e.g. within 8 nm, within 10 nm, or within 15 nm) an upper or top surface of the barrier layer 145.

A dielectric material 130 can be positioned between the memory cell and the via 120 to provide electrical insulation therebetween. In some examples, a second dielectric material 132 can be positioned between the memory cell and the via 120. In some specific examples, the second dielectric material 132 can form a liner in direct contact with the memory cell (e.g. on one or more sides of the memory cell).

FIG. 1B illustrates another example of a memory structure 100B that is identical to memory structure 100A in many aspects. However, in this particular example, memory structure 100B does not include barrier layer 145. Where this is the case, via 120 can extend beyond or above an upper surface (i.e. surface interfacing with bottom surface 151 of conductive layer 150) of the metal ceramic composite material layer 140 for a distance 102. A variety of distances 102 can be employed. In some examples, the distance 102 can be a distance not greater than 30 nm or not greater than 20 nm. In some specific examples, the distance 102 can be from about 1 nm to about 10 nm. Other suitable distances can also be present. Thus, the bottom surface 151 of conductive layer 150 can be non-planar, such that an elevated or indented portion 151A of the bottom surface 151 of conductive layer 150 can directly contact or interface with an upper surface 121 of via 120.

In further detail, the memory cell of the memory structures disclosed herein can generally include any suitable memory cell. In some examples, the memory cell can comprise a chalcogenide material or the memory cell can be a chalcogenide-based memory cell. In some specific examples, the memory cell can comprise, or otherwise be, a phase change memory (PCM) cell. In traditional PCM cells, different physical states of the PCM material can have different levels of electrical resistance. For example, one state, such as an amorphous state, can have a high electrical resistance, while another state, such as a crystalline state, can have a low electrical resistance. The different levels of electrical resistance between the amorphous and crystalline states can be used to store binary information.

In some additional examples, chalcogenide-based memory cells can operate on a somewhat different principle of operation. For example, applying a specific programming pulse (e.g. a positive or negative pulse at a particular voltage) to the chalcogenide material can cause ions to crowd near a particular electrode of the cell. As distribution of the ions in the chalcogenide material changes, the threshold voltage of the chalcogenide material can also change. For example, in some cases, a particular programming pulse can cause ions to crowd near a first electrode to produce a high voltage threshold state. An opposite polarity programming pulse can be used to cause ions to crowd near a second electrode positioned on an opposite side of the chalcogenide material to produce a low voltage threshold state. The difference in voltage threshold between these two states (i.e. set state and reset state, or vice versa) can be used to store different programmed states and can be defined as the programming window of the chalcogenide-based memory cell. This type of memory cell can be referred to as "self-selecting memory" (SSM) or an SSM cell.

In either case, the memory cell can generally include a memory layer (e.g. a PCM layer or an SSM layer) including one or more of a variety of memory materials. In some specific examples, the memory material can be or include a PCM material, which can include any useful material having a stable and detectable change in phase. In some additional examples, the memory material can include germanium, antimony, tellurium, silicon, nickel, gallium, arsenic, silver, tin, gold, lead, bismuth, indium, yttrium, selenium, scandium, boron, oxygen, sulphur, nitrogen, carbon, the like, or a combination thereof. Specific examples of such a materials can include any of a variety of chalcogenide alloys, including, without limitation, Ge—Te, In—Se, Sb—Te, Ge—Sb, Ga—Sb, In—Sb, As—Te, Al—Te, Ge—Sb—Te, Te—Ge—As, In—Sb—Te, In—Se—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, among others. The hyphenated chemical composition notation, as used herein, indicates the elements included in a particular mixture or compound, e.g., chalcogenide alloy, and is intended to represent all stoichiometries involving the indicated elements, e.g., GexSbyTez having variations in stoichiometries, such as $Ge_2Sb_2Te_5$, $Ge_2Sb_2Te_7$, $Ge_1Sb_2Te_4$, $Ge_1Sb_4Te_7$, etc., to form a gradient. In some additional examples, the chalcogenide alloy can be doped, such as with indium, yttrium, scandium, boron, nitrogen, oxygen, the like, or a combination thereof.

One or more (e.g. upper and/or lower) lamina layers can be positioned in direct contact with the memory material. These lamina layers can be adhesion layers or can otherwise facilitate a good electrical connection between the memory layer and surrounding electrode layers. The lamina layers can be formed of a variety of materials. Non-limiting examples can include tungsten, tantalum, titanium, other refractory metals, refractory metal nitrides, refractory metal silicides, refractory metal carbides, refractory metal borides, metal oxides, the like, or a combination thereof.

In some additional examples, the memory cell can also include a select device (SD) layer including a select device material. It is noted that the select device material is generally made of a chalcogenide material, and as such, the materials described herein with respect to the memory layer are applicable here as well. The actual material used in a given memory structure for the memory layer and the SD layer can be different or the same, depending on the design of the structure. In another example, the select device material in the SD layer can be a conductor, semiconductor, or dielectric material. Such materials can be selected as needed to perform an intended function in the memory cell.

In some examples, one or more lamina layers can be positioned in direct contact with the SD layer. For example, a first lamina layer can be positioned between the SD layer and the memory layer. In some additional examples, a second lamina layer can be positioned between the SD layer and a second conductive layer (e.g. lower conductive layer or wordline). These lamina layers can be adhesion layers or can otherwise facilitate a good electrical connection between the SD layer and surrounding electrode layers. The lamina layers can be formed of a variety of materials. Non-limiting examples can include tungsten, tantalum, titanium, other refractory metals, refractory metal nitrides, refractory metal silicides, refractory metal carbides, refractory metal borides, metal oxides, the like, or a combination thereof.

The memory cells can also include an electrode (e.g. first electrode, second electrode, third electrode, etc.). The electrode can include one or more conductive or semiconductive materials. Non-limiting examples can include carbon (C) (e.g. crystalline carbon, amorphous carbon), carbon nitride ($C_xN_y$), n-doped polysilicon, p-doped polysilicon, metals (e.g. Al, Cu, Ni, Cr, Co, Ru, Rh, Pd, Ag, Pt, Au, Ir, Ta, and W, for example), conductive metal nitrides, (e.g. TiN, TaN, WN, and TaCN, for example) conductive metal silicides (e.g. tantalum silicides, tungsten silicides, nickel silicides, cobalt silicides, and titanium silicides, for example), conductive metal silicides nitrides (e.g. TiSiN and WSiN, for example), conductive metal carbide nitrides (e.g. TiCN and WCN, for example), conductive metal oxides (e.g. $RuO_2$, for example), the like, or a combination thereof. In some examples, each electrode in the memory cell can include or be formed of the same materials. In other examples, one or more electrodes can include or be formed of different materials. The electrode can typically have a thickness of from about 3 nm to about 100 nm, or from about 5 nm to about 20 nm, or from about 10 nm to about 30 nm.

As described above, the memory cell can be formed on a second conductive layer (e.g. lower conductive layer or wordline). The second conductive layer can be made of a variety of conductive materials. Non-limiting examples can include tungsten (W), copper (Cu), aluminum (Al), ruthenium (Ru), tungsten nitride (WN), nickel (Ni), tantalum nitride (TaN), platinum (Pt), gold (Au), titanium nitride (TiN), titanium silicon nitride (TiSiN), titanium aluminum nitride (TiAlN), molybdenum nitride (MoN), the like, or a combination thereof.

The memory structures can also include a via. In some examples, the via can be formed in a substantially parallel orientation to the memory cell. Where this is the case, it is noted that the general orientation of the via can be substantially parallel to the memory cell, even if the sides or edges of the via are somewhat sloped due to the fabrication process. In other examples, the via does not have a substantially parallel orientation to the memory cell. The via can be formed of a variety of materials. Non-limiting examples can include tungsten (W), tungsten nitride (WN), nickel (Ni), tantalum nitride (TaN), platinum (Pt), gold (Au), titanium (Ti), titanium nitride (TiN), titanium silicon nitride (TiSiN), titanium aluminum nitride (TiAlN), molybdenum nitride (MoN), the like, or a combination thereof. In some examples, the via can be formed of the same material as the conductive layer and/or the second conductive layer. In some examples, the via can be formed of a different material from the conductive layer and/or the second conductive layer.

A dielectric material can be positioned between the memory cell and the via. In some examples, the dielectric material can include silicon oxide, silicon nitride, silicon oxy-carbide, spin-on-glass, organic polymer, organic/inorganic co-polymer, or other suitable dielectric material. It is also noted that a second dielectric material can be used to line or further isolate the memory cell from the via. In some examples, the second dielectric material can include silicon nitride (e.g. $Si_3N_4$ or in general $Si_xN_y$, where x and y represent any suitable relative quantity) silicon oxide, silicon oxy-carbide, spin-on-glass, organic polymer, organic/inorganic co-polymer, or other suitable dielectric material.

A metal ceramic composite material layer can be formed on the memory cell and the dielectric material. In some specific examples, the metal ceramic composite material can contact a lateral edge of the via. The metal ceramic composite material layer(s) can provide current benefit for selection of individual memory cells. Further, as described previously, exclusion of the metal ceramic composite material layer from between the conductive layer and the via can further increase current benefit for selection of individual memory cells.

The metal ceramic composite material layer can include various combinations of a metal ceramic composite materials. In some examples, the metal ceramic composite material can include tungsten, titanium, tantalum, or the like (e.g. refractory metals, or the like, for example) in combination with silicon, carbon, nitrogen, boron, oxygen, the like, or a combination thereof. It is noted that refractory metals can include titanium, vanadium, chromium, zirconium, niobium, molybdenum, ruthenium, rhodium, hafnium, tantalum, tungsten, rhenium, oxmium, iridium, or a combination thereof. In some examples, the metal ceramic composite material can include any suitable cermet material. In some specific examples, the metal ceramic composite material can include tungsten silicon nitride, tantalum silicon nitride, niobium silicon nitride, molybdenum silicon nitride, titanium silicon nitride, carbon nitride, tungsten carbon nitride, doped alpha silicon, doped alpha germanium, the like, or a combination thereof. In some further examples, the metal ceramic composite material can include tungsten silicon nitride (WSiN). Where this is the case, W can typically be present at from 7 atomic percent (at %) to about 50 at % in the metal ceramic composite material. In some examples, W can be present at from about 10 at % to about 30 at %. Further, Si can typically be present at from about 20 at % to about 60 at % in the metal ceramic composite material. In some further examples, Si can be present at from about 20 at % to about 40 at %.

The metal ceramic composite material layer can have a variety of thicknesses depending on the specific electrical properties desired for the memory cell. In some examples, the metal ceramic composite material layer can have a thickness of from about 1 nm to about 50 nm, or from about 1 nm to about 10 nm. In some further examples, the metal ceramic composite material layer can have an electrical resistivity of from 20 mOhm·cm to 300 mOhm·cm.

In some examples, a barrier layer can be formed on the metal ceramic composite material layer. The barrier layer can typically be a protective layer for underlying layers or features of the memory structure. For example, the barrier layer can be a stopping layer for a planarization step. In some examples, the barrier layer can remain in the final memory structure. In other examples, the barrier layer can be removed from the memory structure. The barrier layer can have a variety of thicknesses. In some examples, the barrier layer can have a thickness of from about 5 nm to about 15 nm.

The barrier layer can include or be made of a variety of materials. In some examples, the barrier layer can include one or more conductive or semiconductive materials. Non-limiting examples can include carbon (C), carbon nitride ($C_xN_y$), Al, Ti, TiN, TaN, AlTaN, Mo, Ru, SiC, WN, WCN, the like, or a combination thereof.

In some examples, the barrier layer can be formed of a dielectric material. Where this is the case, the barrier layer can be formed of any dielectric material that can be selectively removed without removing or substantially affecting the via. Non-limiting examples of suitable materials can include silicon nitride (e.g. $Si_3N_4$ or in general $Si_xN_y$, where x and y represent any suitable relative quantity), SiON, the like, or a combination thereof. However, it is noted that where the barrier layer is formed of a dielectric material, the barrier layer can typically be removed prior to forming the conductive layer. Where this is the case, the conductive layer can be formed in direct contact with the metal ceramic composite material layer. Thus, the via will extend beyond the metal ceramic composite material layer and the conductive layer can be formed about an upper portion (e.g. upper surface and upper lateral edges) of the via.

A conductive layer (e.g. upper conductive layer or bitline) can be formed on the barrier layer or the metal ceramic composite material layer, depending on the design of the memory structure. The conductive layer can be made of a variety of conductive materials. Non-limiting examples can include tungsten (W), copper (Cu), aluminum (Al), ruthenium (Ru), tungsten nitride (WN), nickel (Ni), tantalum nitride (TaN), platinum (Pt), gold (Au), titanium nitride (TiN), titanium silicon nitride (TiSiN), titanium aluminum nitride (TiAlN), molybdenum nitride (MoN), the like, or a combination thereof. In some examples, the conductive layer and the second conductive layer can include or be formed of the same materials. In other examples, the conductive layer and the second conductive layer can include or be formed of different materials. In some further examples, the conductive layer and the second conductive layer can be formed of the same material(s), but both layers can include or be formed of materials that are different from the materials forming the via.

A lower or bottom surface of the conductive layer can directly contact an upper surface of the via. This can minimize electrical resistivity between the conductive layer and the via and minimize energy consumption of the memory structure. In some specific examples, the lower or bottom surface of the conductive layer can be in direct contact with an upper surface of the via and an upper surface of a barrier layer. In other specific examples, the lower or bottom surface of the conductive layer can be in direct contact with an upper surface of the via and an upper surface of the metal ceramic composite material layer.

A second metal ceramic composite material layer can optionally be formed between the memory cell and the second conductive layer. The second metal ceramic composite material layer can generally be formed of the same material types listed for the first metal ceramic composite material layer. In some examples, the second metal ceramic composite material layer can include or be formed of the same materials as the first metal ceramic composite material layer. In other examples, the first metal ceramic composite material layer and the second metal ceramic composite material layer can include or be formed of different materials.

Individual memory structures as described herein can be included in a memory device. The memory devices can include an array of memory cells arranged in columns and rows, a plurality of vias aligned with individual rows of memory cells, dielectric material separating individual memory cells from one another and from the plurality of vias, individual metal ceramic composite material layers on separate rows of memory cells and corresponding dielectric material, and individual conductive layers on individual metal ceramic composite material layers and in direct contact with individual upper surfaces of corresponding vias.

Figure 2A:
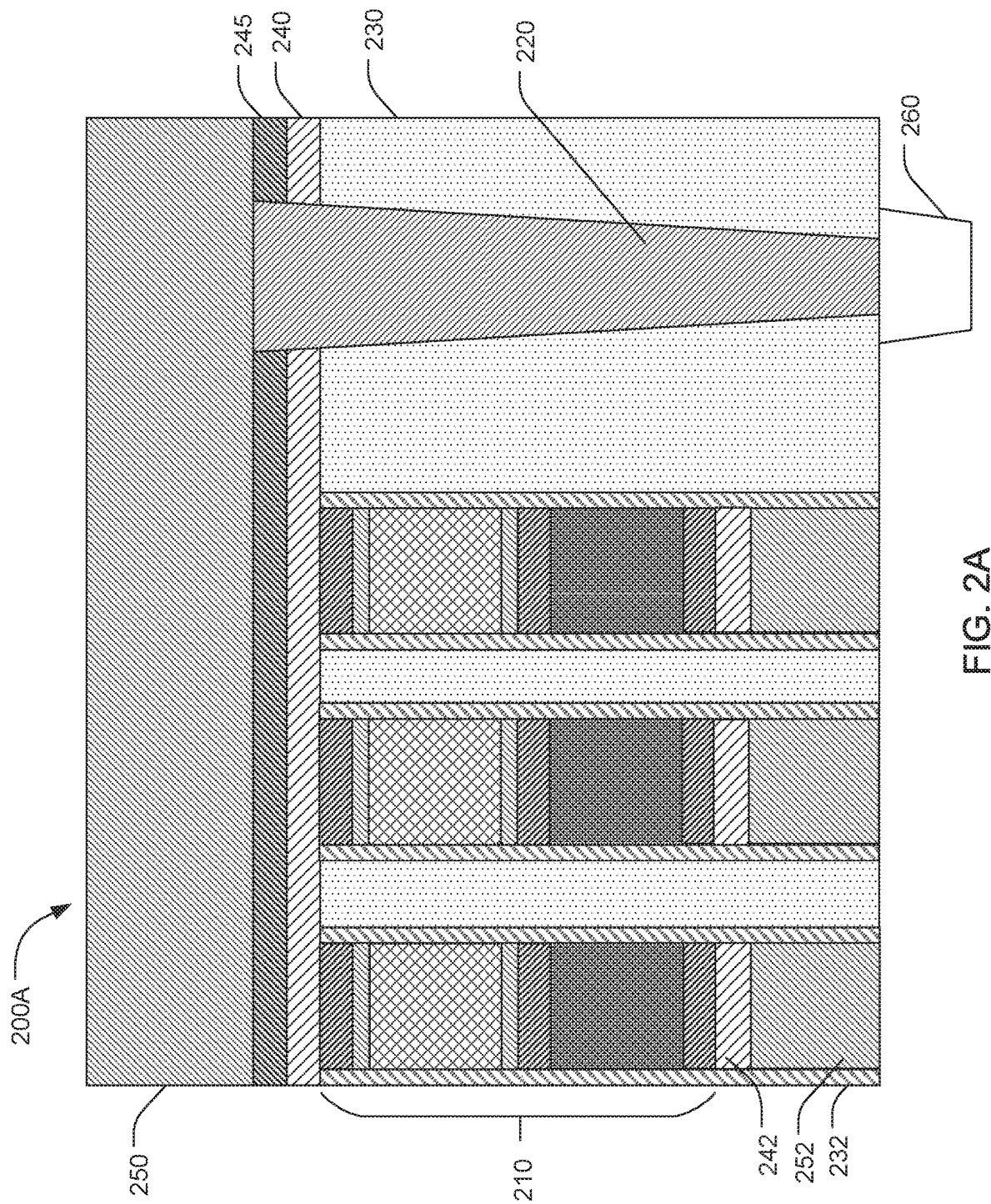
FIG. 2A illustrates a memory device, in accordance with an example embodiment.
Figure 2B:
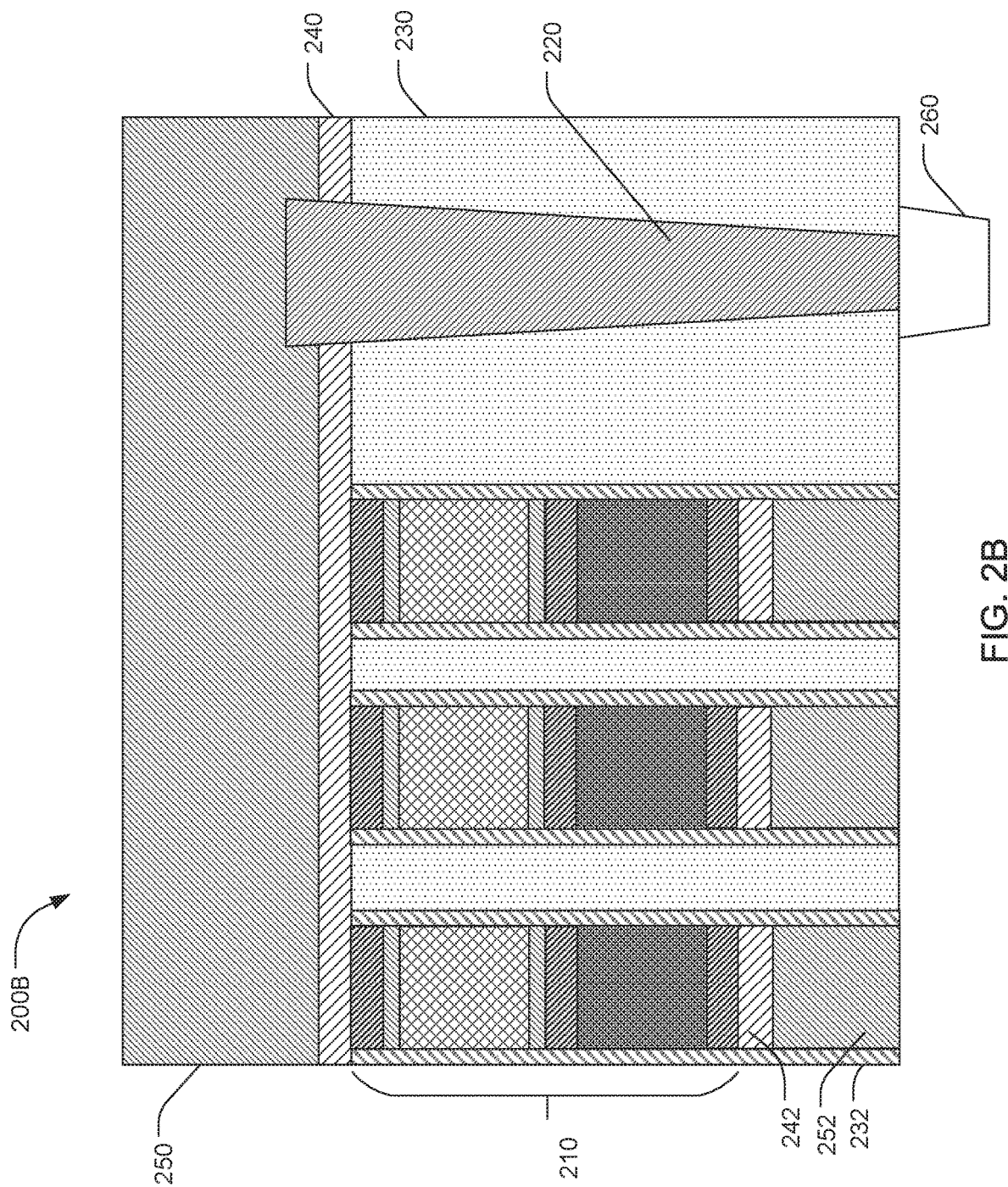
FIG. 2B illustrates a memory device, in accordance with an example embodiment.

Some examples of memory devices are illustrated in FIGS. 2A and 2B. For example, the memory device 200A of FIG. 2A can include an array of memory cells 210 including the same layers as described with respect to FIG. 1A. The array of memory cells 210 can be arranged in columns and rows between conductive layers (e.g. conductive layer 250 and second conductive layer 252) to form independently addressable memory cells (See also FIGS. 5A-5C for additional structural detail). Individual vias 220 can be formed between individual electrical contacts or interconnects 260 and individual conductive layers 250. As described previously, an upper surface of individual vias 220 can be in direct contact with a bottom surface of individual conductive layers 250. Dielectric material 230 can be positioned between individual memory cells 210 and between the array of memory cells 210 and individual vias 220. A second dielectric material 232 can also be positioned between individual memory cells 210 and between the array of memory cells 210 and individual vias 220. In some examples, the second dielectric material 232 can form a liner in direct contact with one or more sides of individual memory cells 210. Individual metal ceramic composite material layers 240 can be formed on individual rows of memory cells 210 and corresponding dielectric material 230 and second dielectric material 232. Individual barrier layers 245 can be formed on individual metal ceramic composite material layers 240. Individual metal ceramic composite material layers 240 and barrier layers 245 can contact lateral edges of corresponding vias 220 at an upper portion thereof, but are not positioned between the corresponding via 220 and conductive layer 250. Individual second metal ceramic composite material layers 242 can be positioned between individual memory cells 210 and individual second conductive layers 252.

Figure 6A:
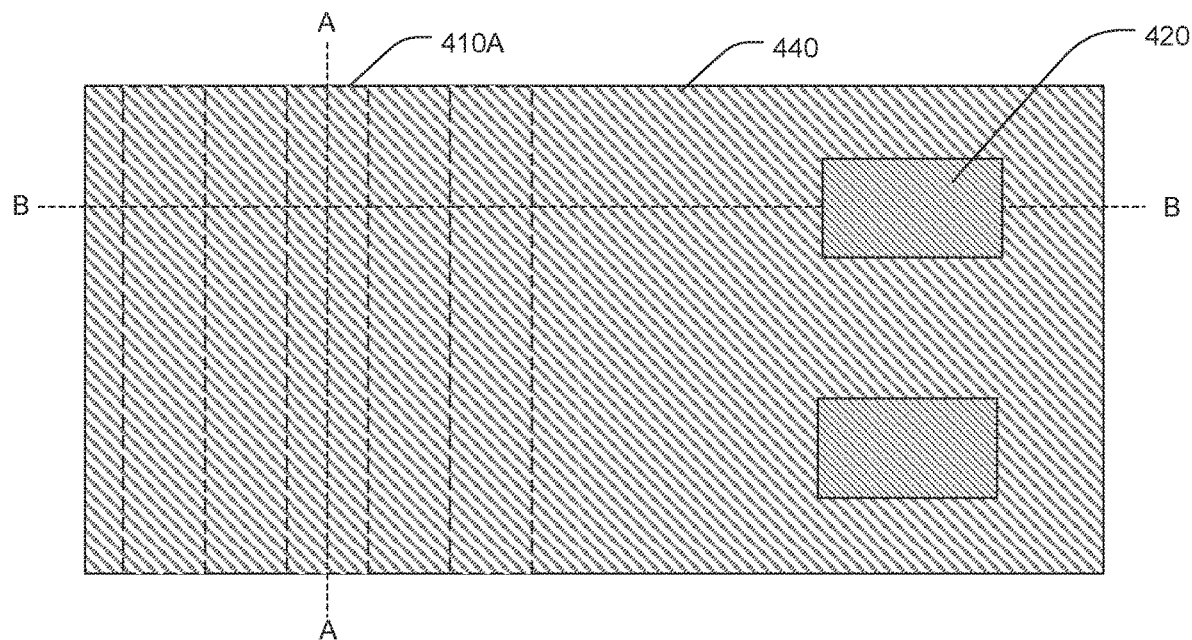
FIG. 6A illustrates a top view of a memory device at one stage of manufacturing, in accordance with an example embodiment.
Figure 6B:
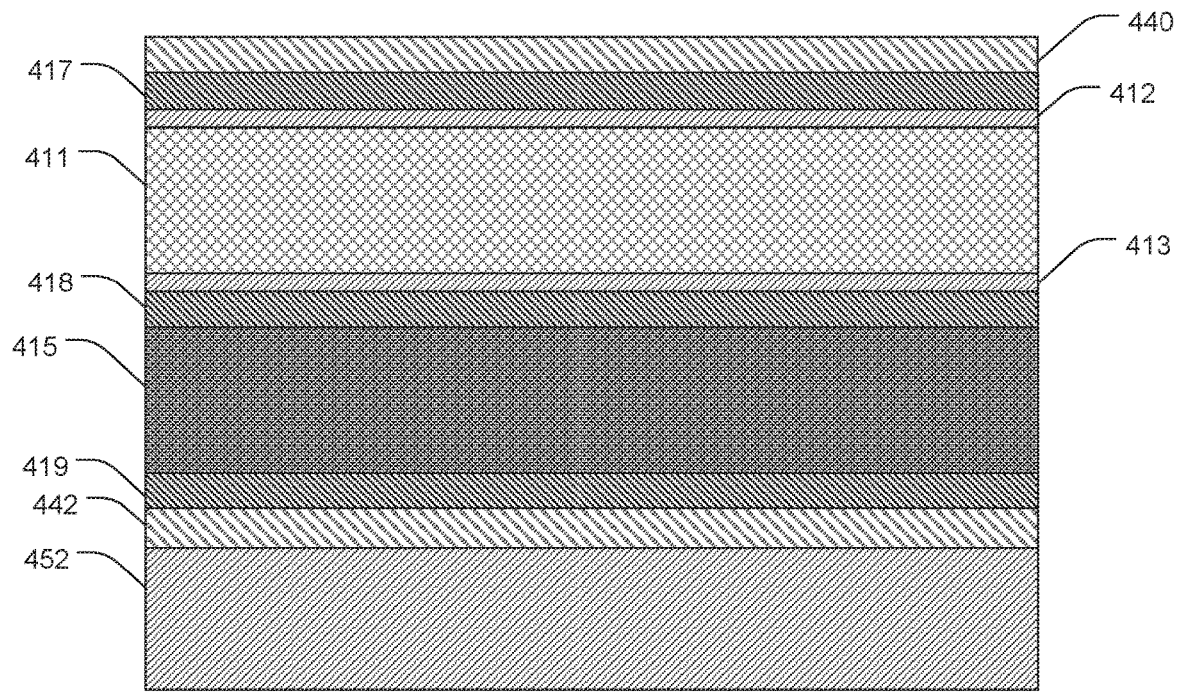
FIG. 6B illustrates a cross-sectional view of the memory device of FIG. 6A along line A-A.
Figure 6C:
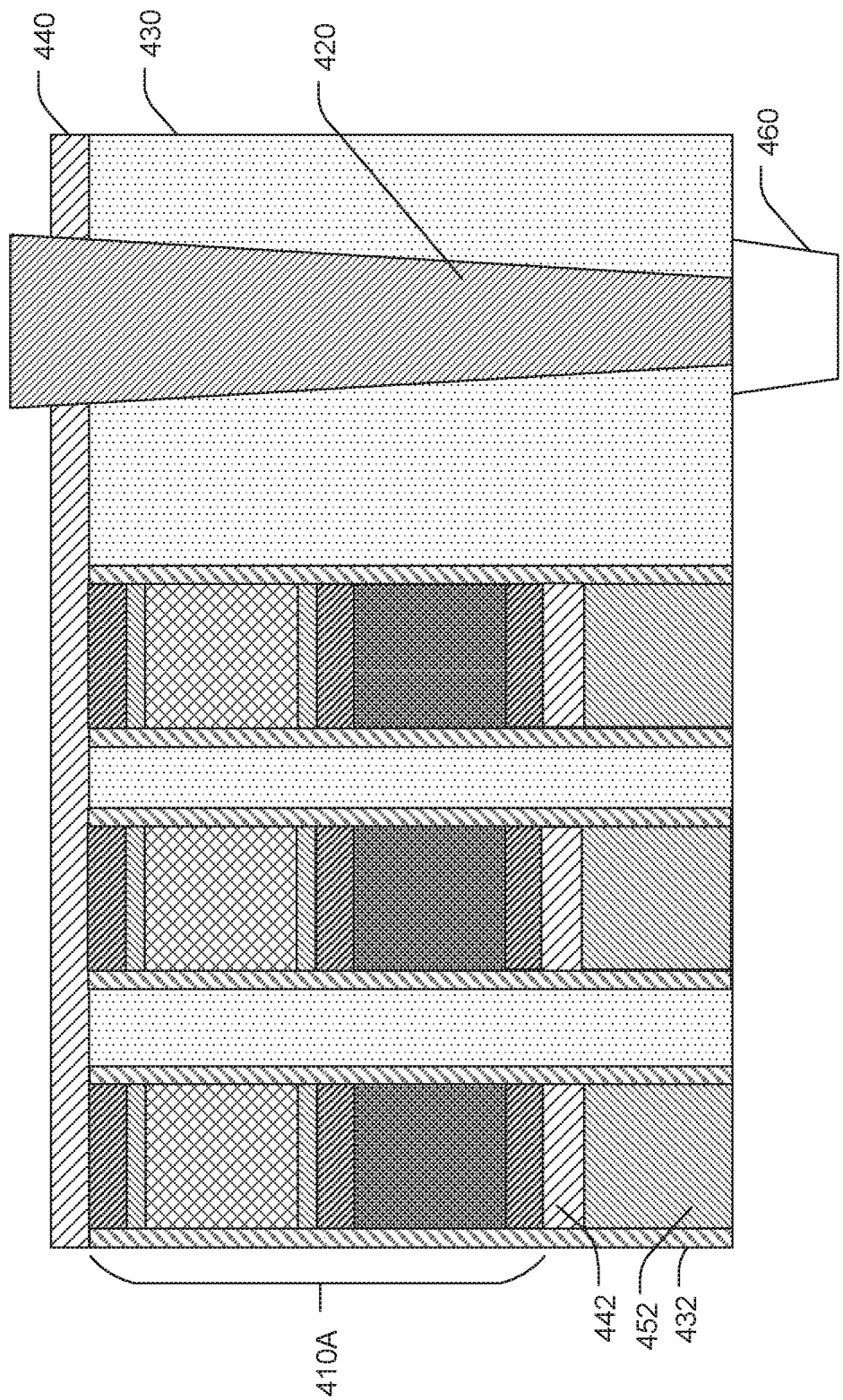
FIG. 6C illustrates a cross-sectional view of the memory device of FIG. 6A along line B-B.
Figure 6D:
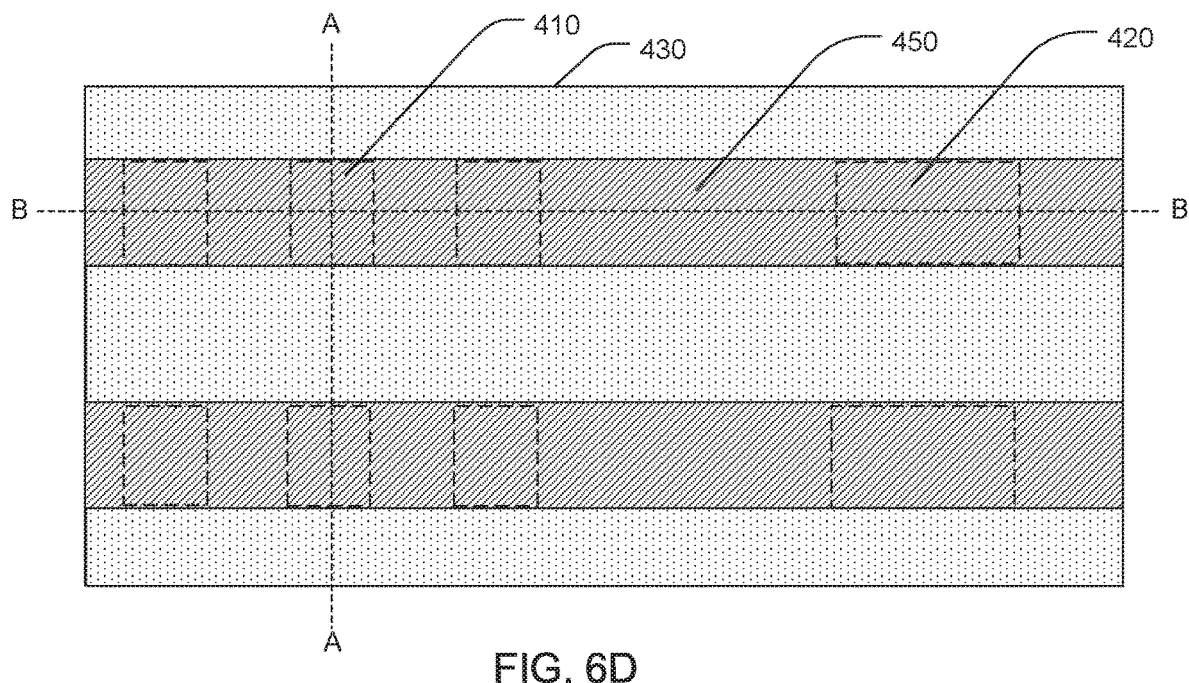
FIG. 6D illustrates a top view of a memory device at one stage of manufacturing, in accordance with an example embodiment.
Figure 6E:
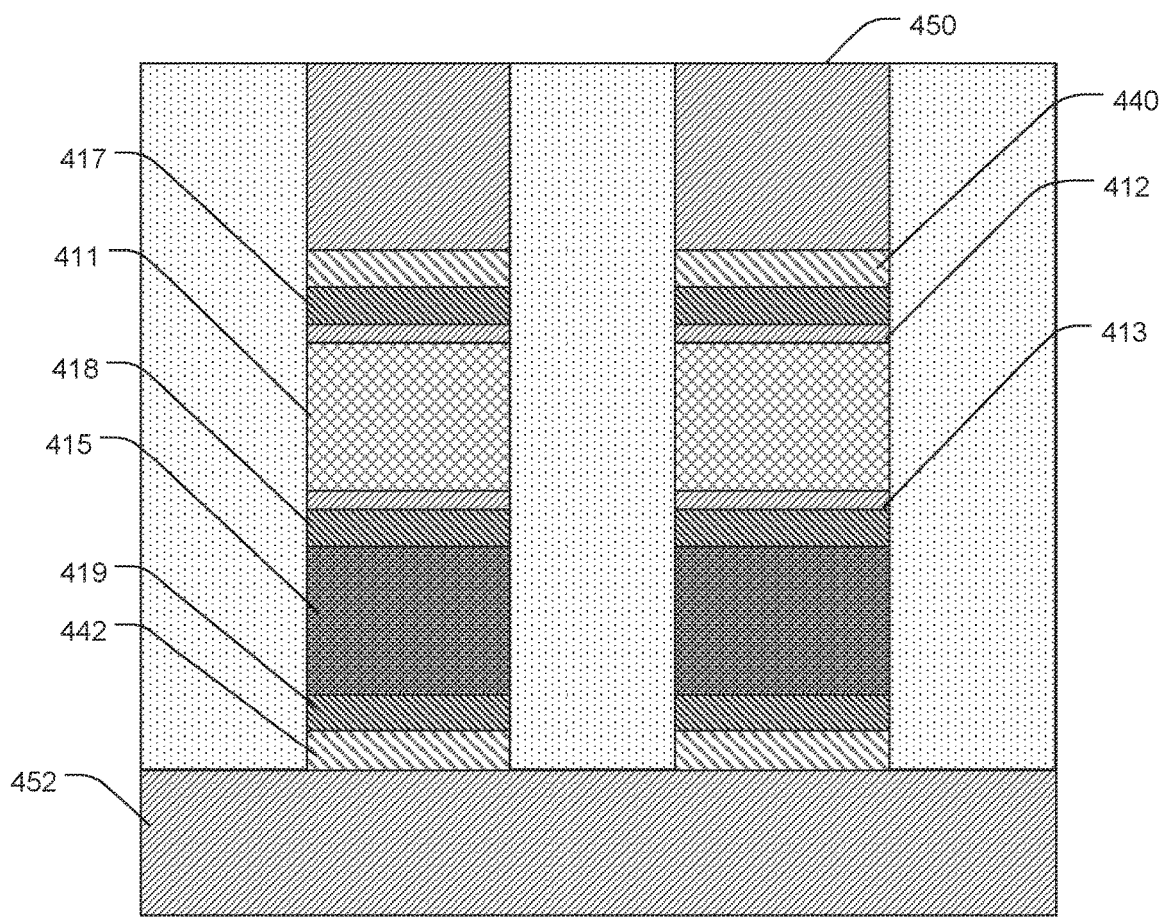
FIG. 6E illustrates a cross-sectional view of the memory device of FIG. 6D along line A-A.
Figure 6F:
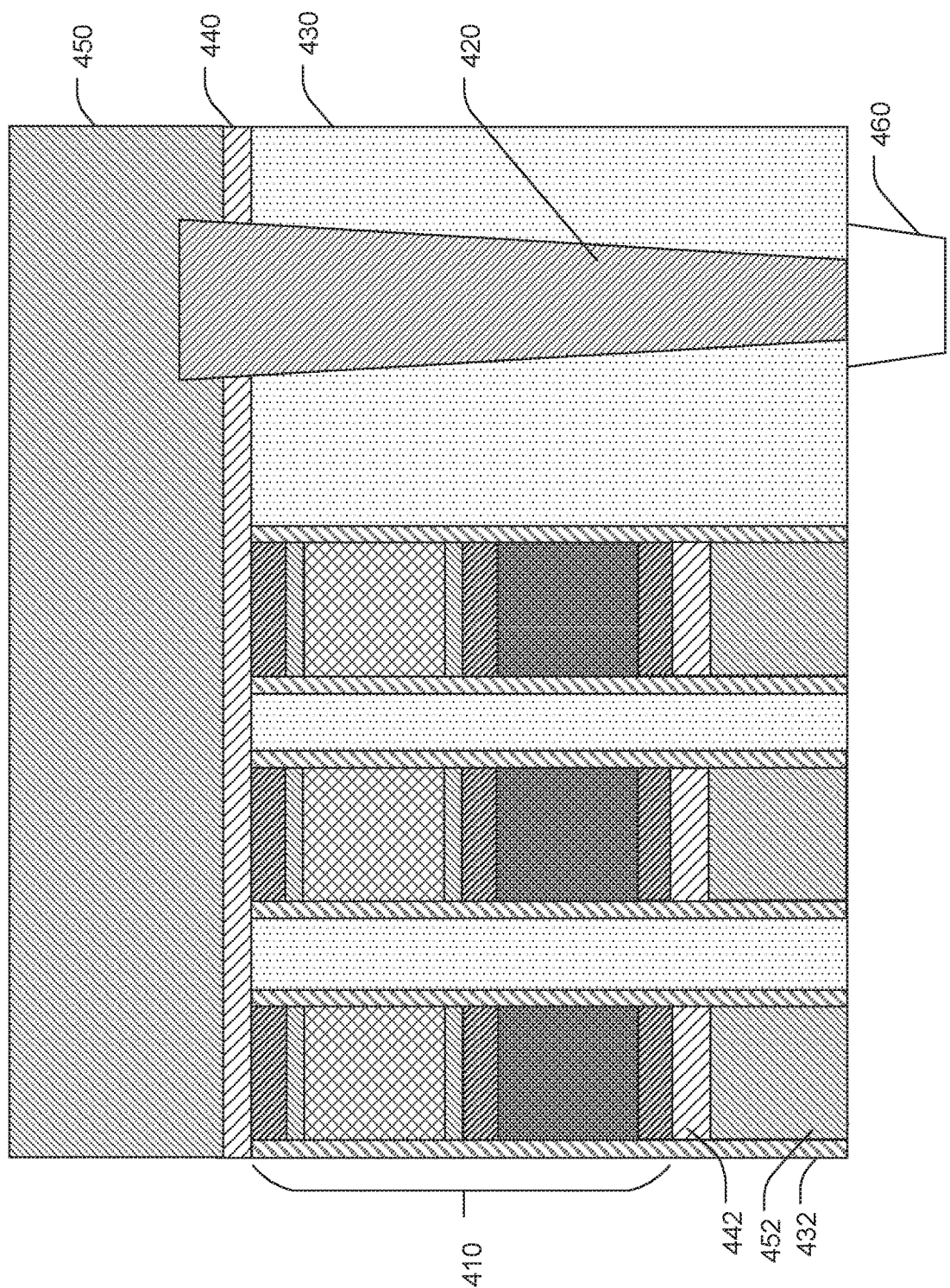
FIG. 6F illustrates a cross-sectional view of the memory device of FIG. 6D along line B-B.

Memory device 200B, as illustrated in FIG. 2B, is identical to memory device 200A in many aspects (See FIGS. 6D-6F for additional structural details). However, in this particular example, memory device 200B does not include barrier layers 245. Where this is the case, individual vias 220 can extend beyond or above an upper surface of individual metal ceramic composite material layers 240. Thus, the bottom surface of individual conductive layers 250 can be non-planar, such that an elevated or indented portion of the bottom surface of individual conductive layers 250 can directly contact or interface with an upper surface of corresponding vias 220.

Figure 2C:
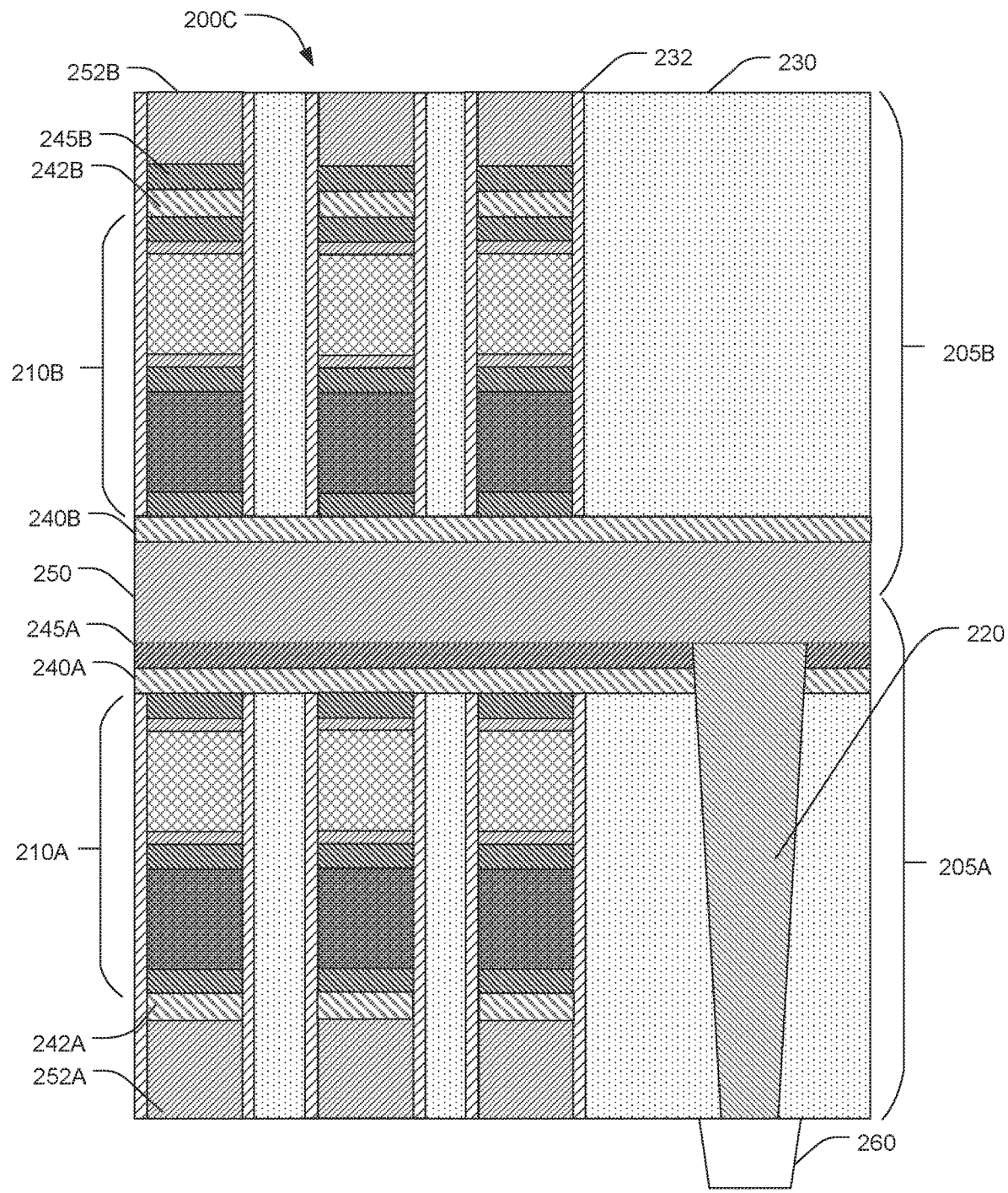
FIG. 2C illustrates a memory device, in accordance with an example embodiment.
Figure 2D:
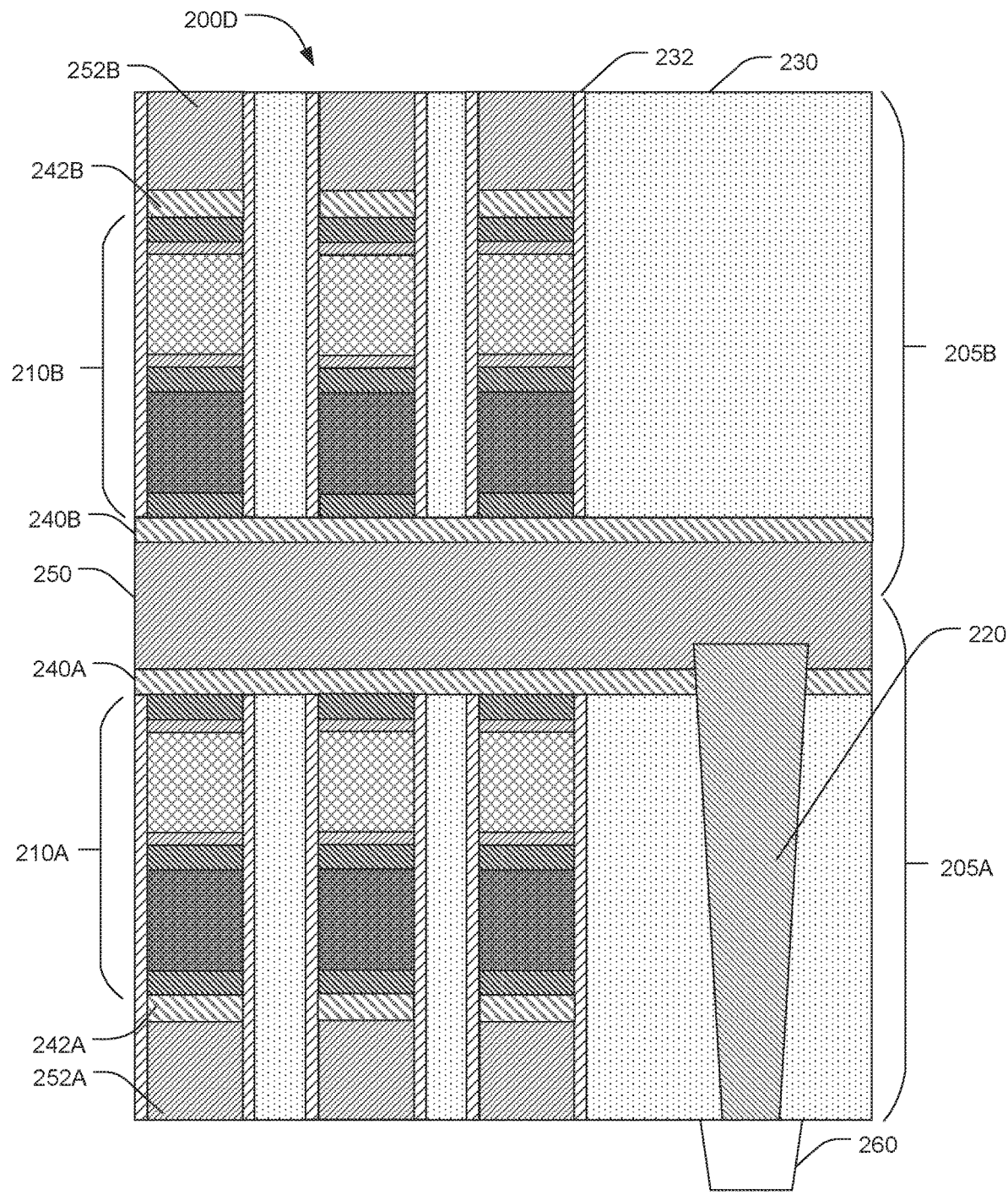
FIG. 2D illustrates a memory device, in accordance with an example embodiment.

It is further noted that the memory devices presented in FIGS. 2A and 2B can illustrate a single deck of the memory device. In some examples, the memory devices can include a plurality of decks, as illustrated in FIGS. 2C and 2D. For example, FIG. 2C illustrates a memory device 200C having a first deck 205A and a second deck 205B. The first deck 205A and the second deck 205B include a plurality of memory cells 210A and 210B, respectively, as described in FIG. 1A. More specifically, for first deck 205A, individual memory cells 210A are positioned between individual conductive layers 250 and individual lower second conductive layers 252A. Individual lower metal ceramic composite material layers 242A are positioned between individual memory cells 210A and individual conductive layers 250. Individual lower second metal ceramic composite material layers 242A are positioned between individual memory cells 210A and individual lower second conductive layers 252A. Individual lower barrier layers 245A are positioned between individual lower metal ceramic composite material layers 240A and individual conductive layers 250.

Similarly, with respect to second deck 205B, individual memory cells 210B are positioned between individual conductive layers 250 and individual upper second conductive layers 252B of deck 205B. Individual upper metal ceramic composite material layers 242B are positioned between individual conductive layers 250 and individual memory cells 210B. Individual upper second metal ceramic composite material layers 242B are positioned between memory cells 210B and individual upper second conductive layers 252B. Individual upper barrier layers 245B are positioned between individual upper metal ceramic composite material layers 240B and individual upper second conductive layers 252B. It is noted that individual layers 252A, 252B, 242B, and 245B can extend in a direction transverse to individual conductive layers 250 (i.e. in and out of the page) and can be aligned with additional memory cells along corresponding columns of memory cells.

Memory device 200D, as illustrated in FIG. 2D, can be substantially identical to memory device 200C in many aspects. However, in this particular example, memory device 200D does not include individual lower barrier layers 245A or individual upper barrier layers 245B. Where this is the case, individual vias 220 can extend beyond or above an upper surface of individual lower metal ceramic composite material layers 240A. Thus, the bottom surface of individual conductive layers 250 can be non-planar, such that an elevated or indented portion of the bottom surface of individual conductive layers 250 can directly contact or interface with an upper surface of corresponding vias 220.

Figure 3:
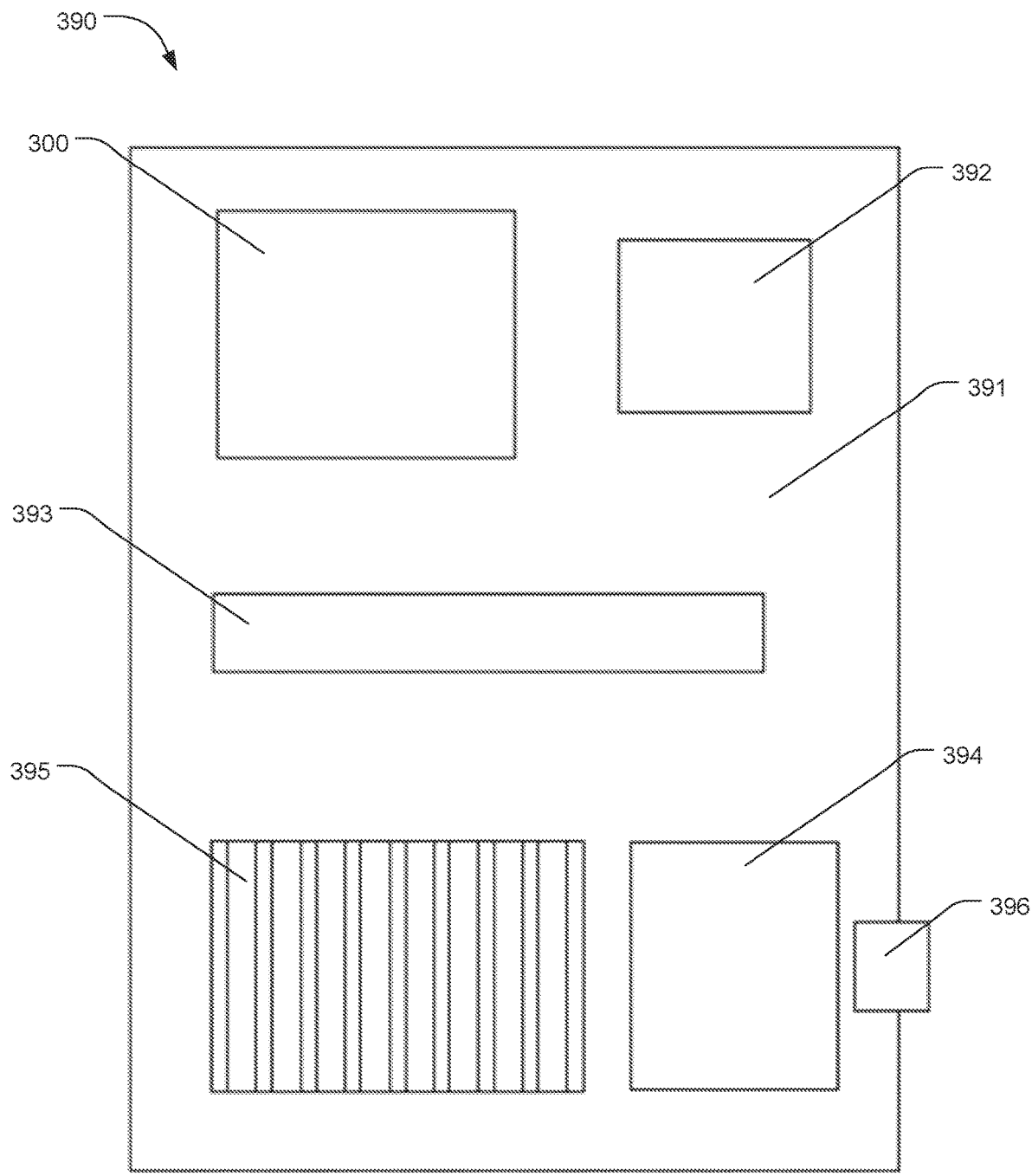
FIG. 3 illustrates a computing system, in accordance with an example embodiment.

In some examples, a memory device as described herein can be included in a computing system. As illustrated in FIG. 3, computing system 390 can include a motherboard 391 and a memory device 300 as described herein that is operably coupled to the motherboard 391. In one aspect, a computing system 390 can also include a processor 392, an additional memory device 393, a radio 394, a heat sink 395, a port 396, a slot, or any other suitable device or component, which can be operably coupled to the motherboard 391. The computing system 390 can comprise any type of computing system, such as a desktop computer, a laptop computer, a tablet computer, a smartphone, a wearable device, a server (e.g. data storage server, cloud storage server, or the like), etc. Other embodiments need not include all of the features specified in FIG. 3, and may include alternative features not specified in FIG. 3.

Circuitry used in electronic components or devices (e.g. a die) of a computing system can include hardware, firmware, program code, executable code, computer instructions, and/or software. Electronic components and devices can include a non-transitory computer readable storage medium which can be a computer readable storage medium that does not include signal. In the case of program code execution on programmable computers, the computing systems recited herein may include a processor, a storage medium readable by the processor (including volatile and non-volatile memory and/or storage elements), at least one input device, and at least one output device. Volatile and non-volatile memory and/or storage elements may be a RAM, EPROM, flash drive, optical drive, magnetic hard drive, solid state drive, or other medium for storing electronic data. Node and wireless devices may also include a transceiver module, a counter module, a processing module, and/or a clock module or timer module. One or more programs that may implement or utilize any techniques described herein may use an application programming interface (API), reusable controls, and the like. Such programs may be implemented in a high level procedural or object-oriented programming language to communicate with a computer system. However, the program(s) may be implemented in assembly or machine language, if desired. In any case, the language may be a compiled or interpreted language, and combined with hardware implementations.

The present disclosure also describes methods of manufacturing a memory device. Generally, the methods can include forming an array of memory cells arranged in columns and rows, positioning dielectric material to separate individual memory cells from one another, forming a plurality of vias within the dielectric material where individual vias are aligned with individual rows of memory cells, forming individual metal ceramic composite material layers on separate rows of memory cells and corresponding dielectric material, and forming individual conductive layers on individual metal ceramic composite material layers and in direct contact with individual upper surfaces of corresponding vias.

FIGS. 4A-4I illustrate an example of a memory device at various stages of manufacturing. FIGS. 5A-5C illustrate one example of a manufacturing process proceeding from FIGS. 4A-4I. FIGS. 6A-6F illustrate another example of a manufacturing process proceeding from FIGS. 4A-4I. For convenience of discussion, and without intending to be limiting, a memory device can be considered to have two different patterning sequences providing for 3D architectures. A "first cut" can refer to the patterning in the second conductive layer (e.g. wordline) direction from the first electrode 417 down through the second conductive layer 452. The "second cut" can refer to the patterning in the first conductive layer (e.g. bitline) direction from the top of the first conductive layer 450 down to the top of the second conductive layer 452.

Figure 4A:
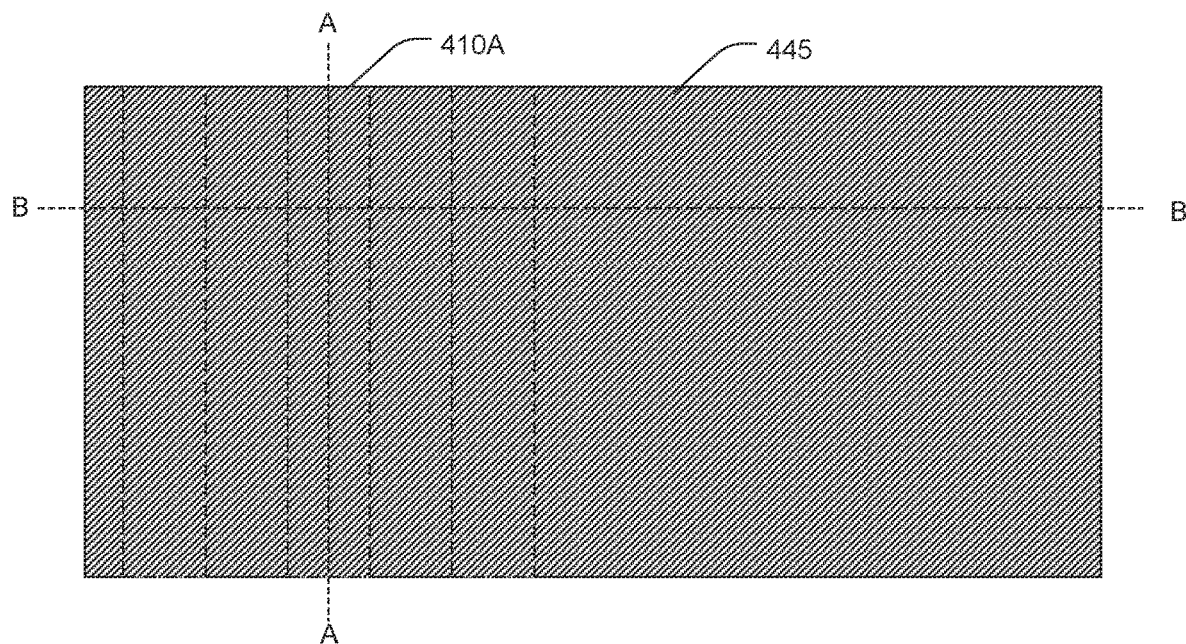
FIG. 4A illustrates a top view of a memory device at one stage of manufacturing, in accordance with an example embodiment.
Figure 4B:
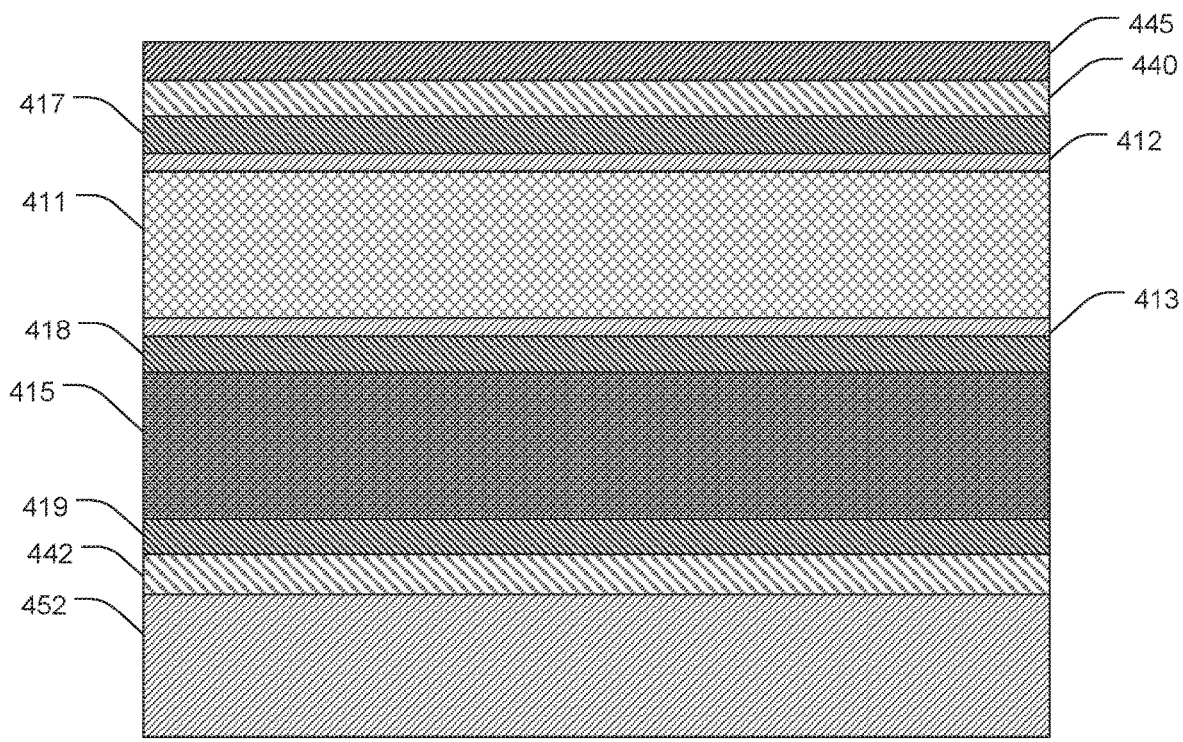
FIG. 4B illustrates a cross-sectional view of the memory device of FIG. 4A along line A-A.
Figure 4C:
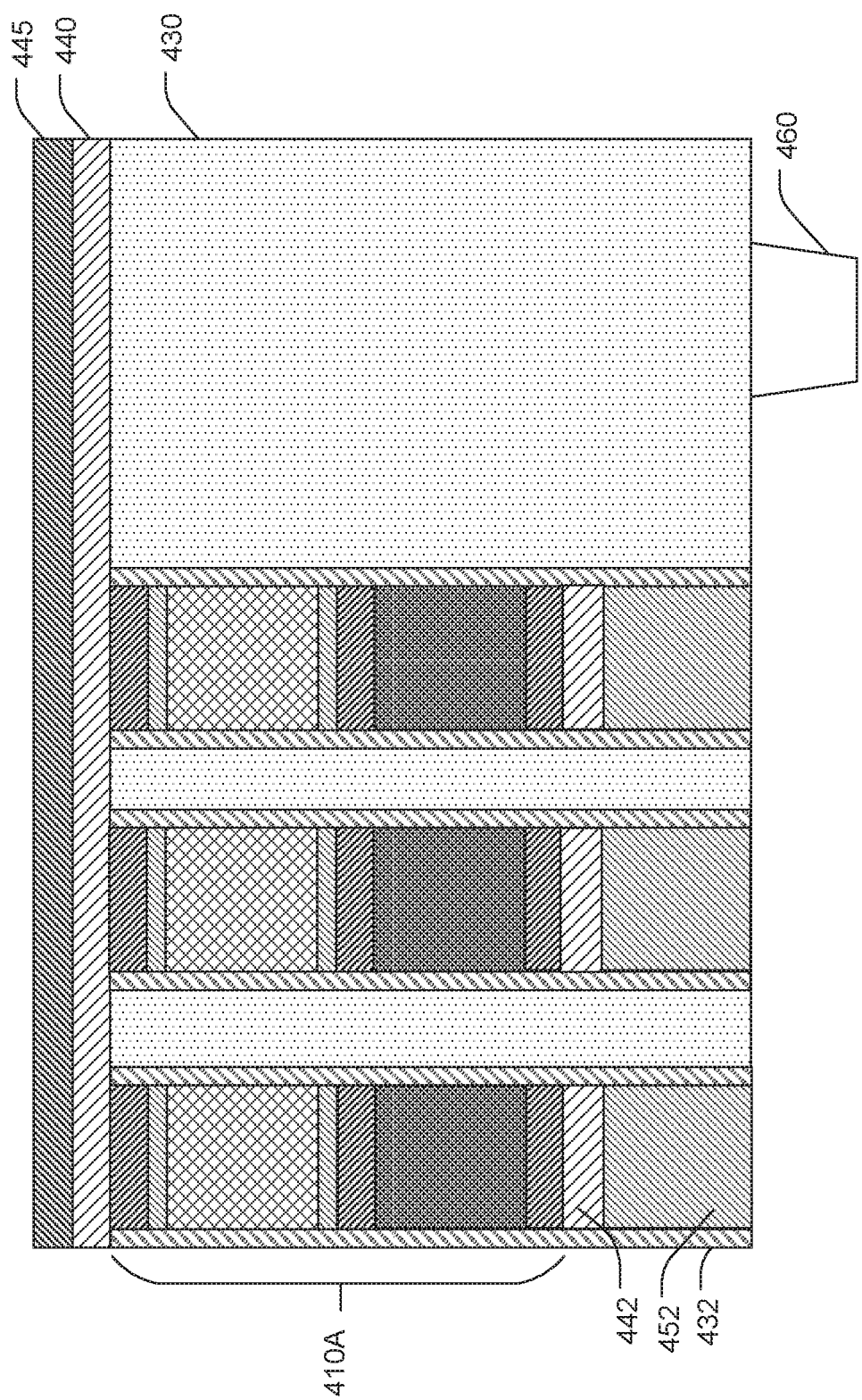
FIG. 4C illustrates a cross-sectional view of the memory device of FIG. 4A along line B-B.
Figure 5A:
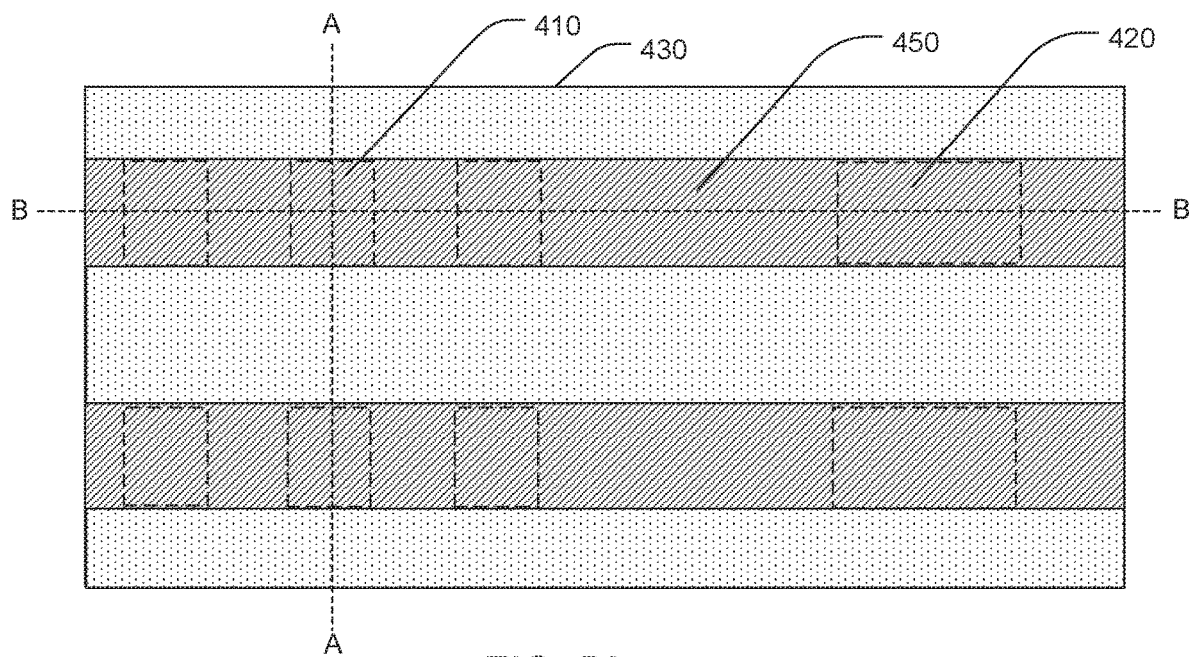
FIG. 5A illustrates a top view of a memory device at one stage of manufacturing, in accordance with an example embodiment.
Figure 5B:
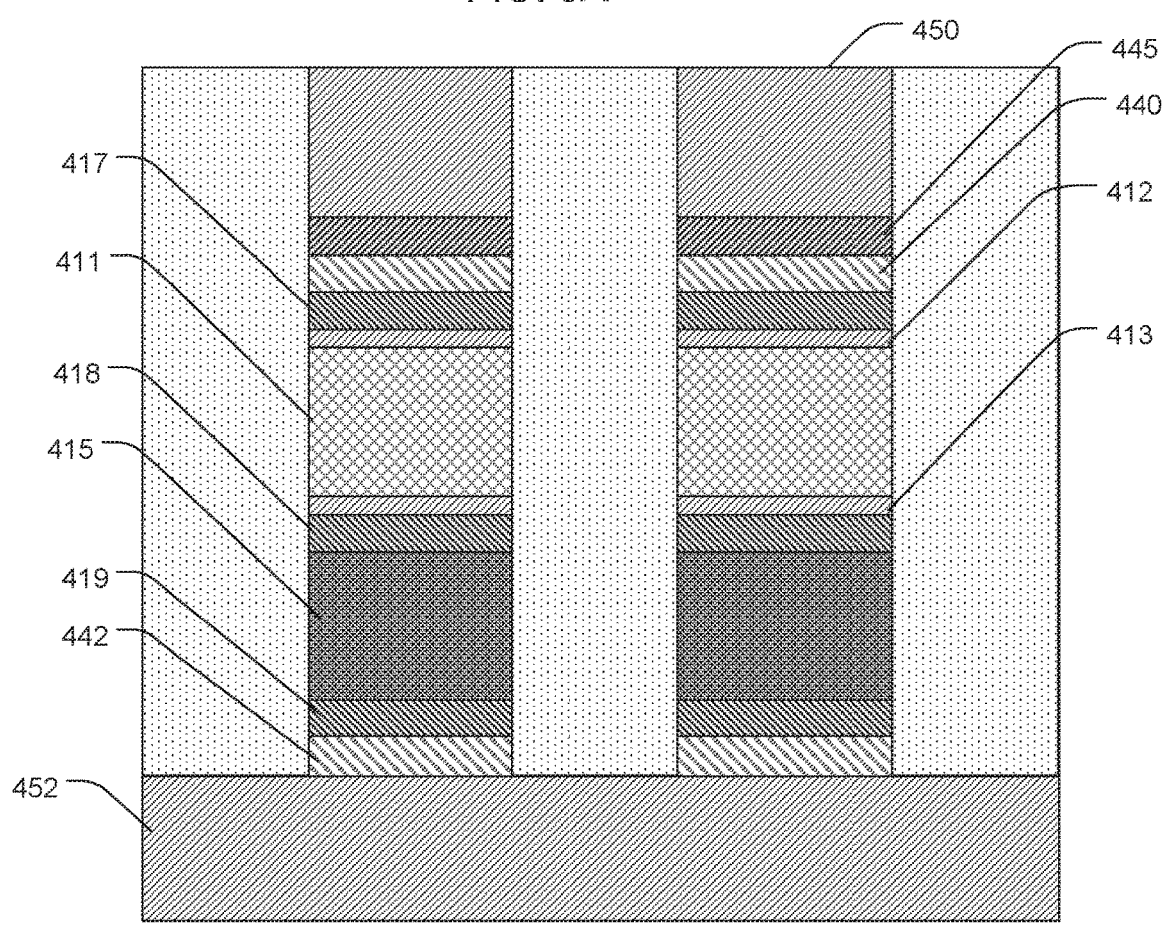
FIG. 5B illustrates a cross-sectional view of the memory device of FIG. 5A along line A-A.
Figure 5C:
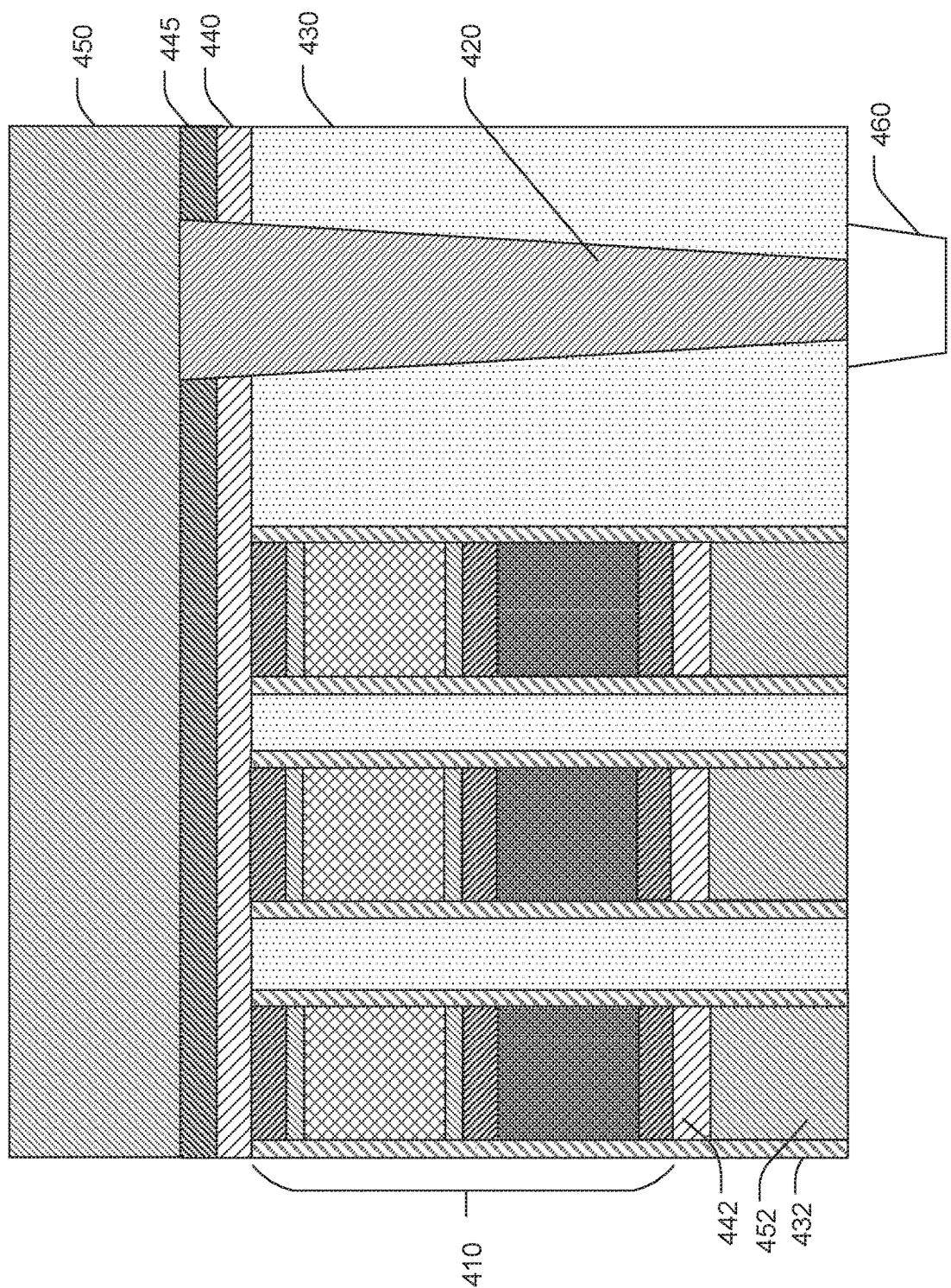
FIG. 5C illustrates a cross-sectional view of the memory device of FIG. 5A along line B-B.

As can be seen in FIGS. 4A-4C, the memory device includes a plurality of columns of precursor memory cells 410A. FIGS. 4A-4C can represent a memory device after a first cut, for example. As described previously, individual precursor memory cells 410A can include a memory material 411 (e.g. a phase change memory (PCM) material, for example), an upper lamina layer 412, a lower lamina layer 413, a select device (SD) layer 415, a first electrode 417, a second electrode 418, and a third electrode 419. Individual precursor memory cells 410A can be formed on individual second conductive layers 452 (e.g. wordlines). Individual second metal ceramic composite material layers 442 can be formed between individual precursor memory cells 410A and individual second conductive layers 452.

A dielectric material 430 can be positioned to separate individual columns of precursor memory cells 410A from one another. In some examples, a second dielectric material 432 can also be positioned to separate individual columns of precursor memory cells 410A from one another. In some specific examples, second dielectric material 432 can form a liner in direct contact with one or more sides of individual precursor memory cells 410A or subsequent memory cells 410.

A metal ceramic composite material layer 440 (or first metal ceramic composite material layer) can be formed on the array of precursor memory cells 410A and the dielectric material 430, 432. A barrier layer 445 can be formed on the metal ceramic composite material layer 440. Any suitable deposition method or other method of forming the various layers and components of the memory device can be used. Non-limiting examples can include chemical vapor deposition (CVD), physical vapor deposition (PVD), atomic layer deposition (ALD), spin coating, the like, or a combination thereof.

Figure 4D:
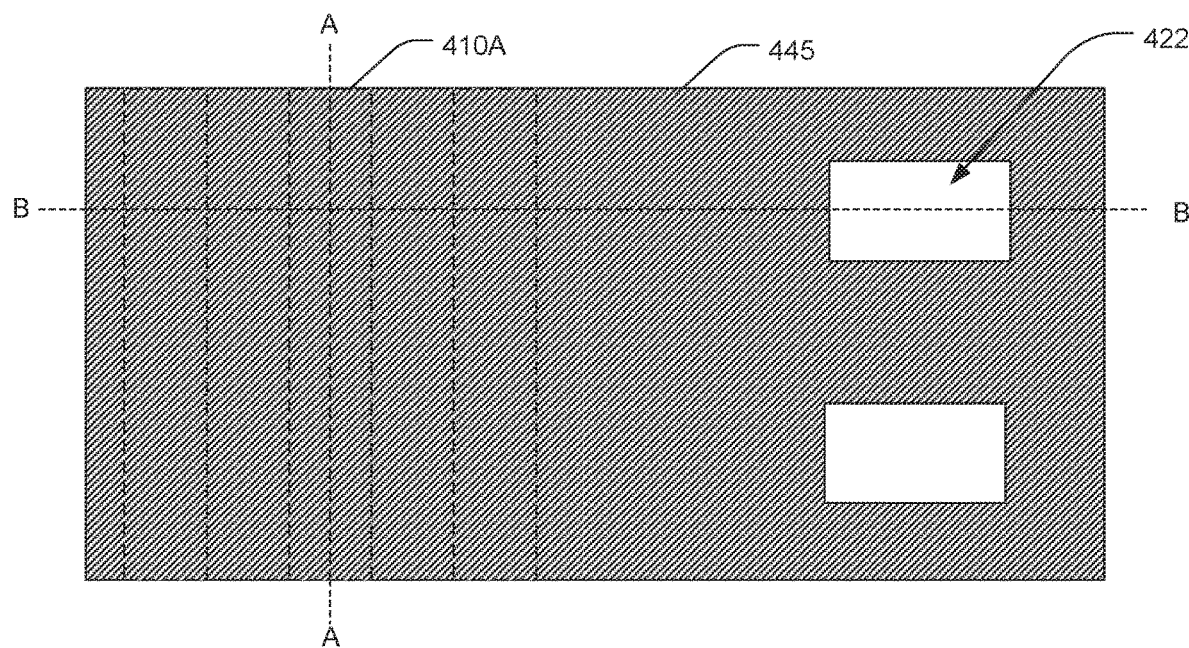
FIG. 4D illustrates a top view of a memory device at one stage of manufacturing, in accordance with an example embodiment.
Figure 4E:
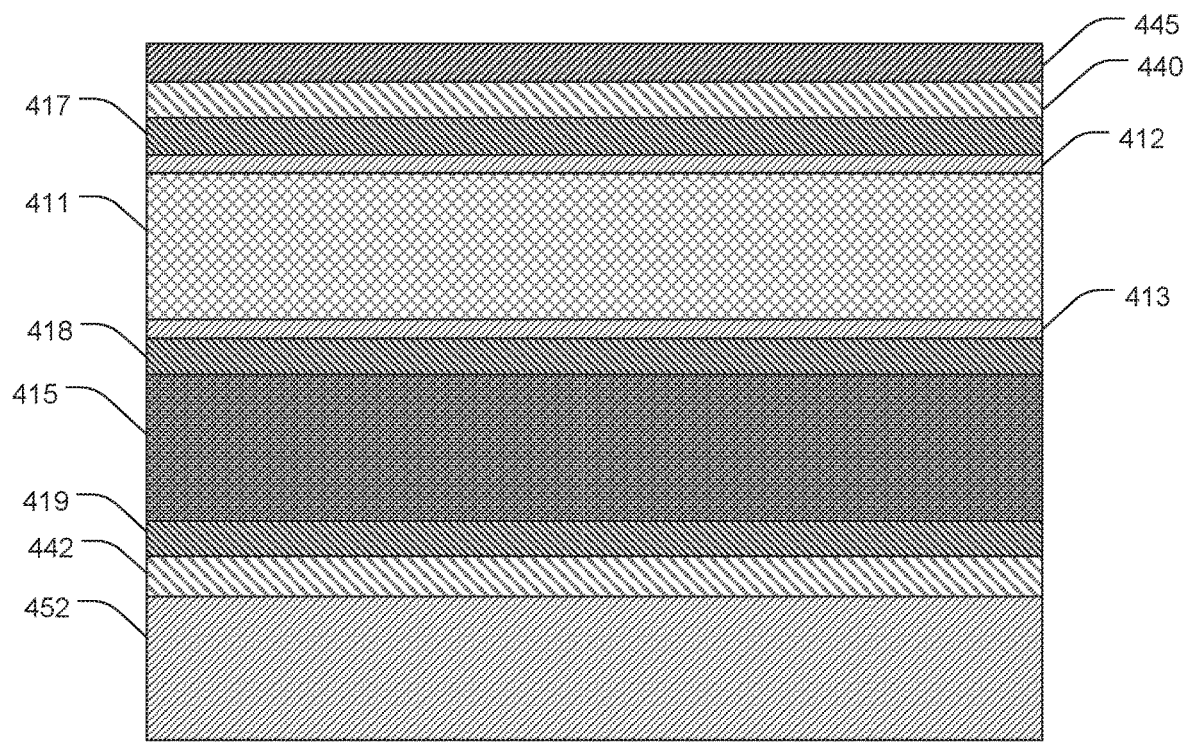
FIG. 4E illustrates a cross-sectional view of the memory device of FIG. 4D along line A-A.
Figure 4F:
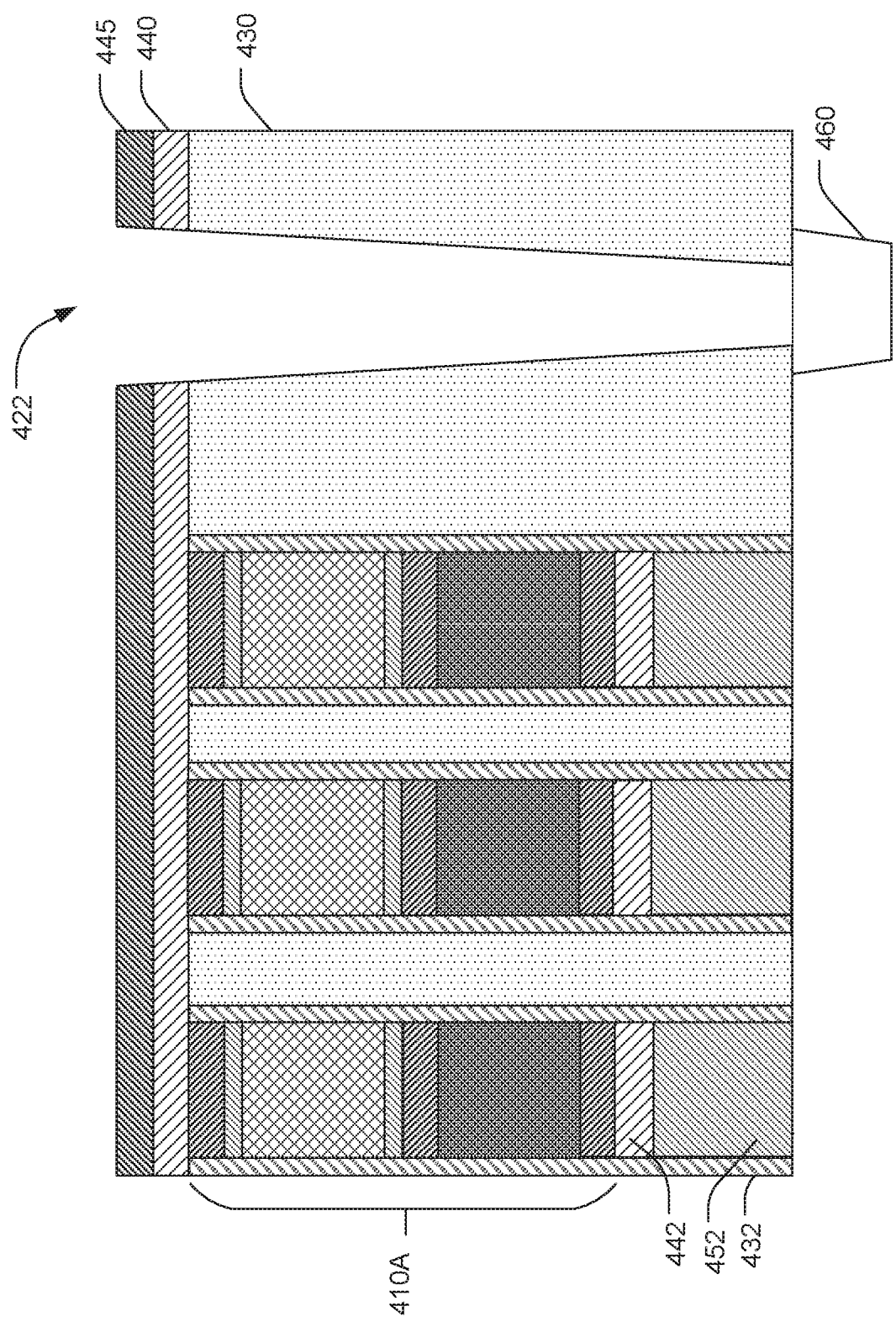
FIG. 4F illustrates a cross-sectional view of the memory device of FIG. 4D along line B-B.

As illustrated in FIGS. 4D-4F, individual trenches 422 can be formed through the dielectric material 430, the metal ceramic composite material layer 440, and the barrier layer 445 down to individual electrical contacts or interconnects 460. The trenches 422 can be formed using a variety of methods, including wet etching, dry etching, the like, or a combination thereof. In some specific examples, the etching process can provide trenches 422 having a substantially trapezoidal shape.

Figure 4G:
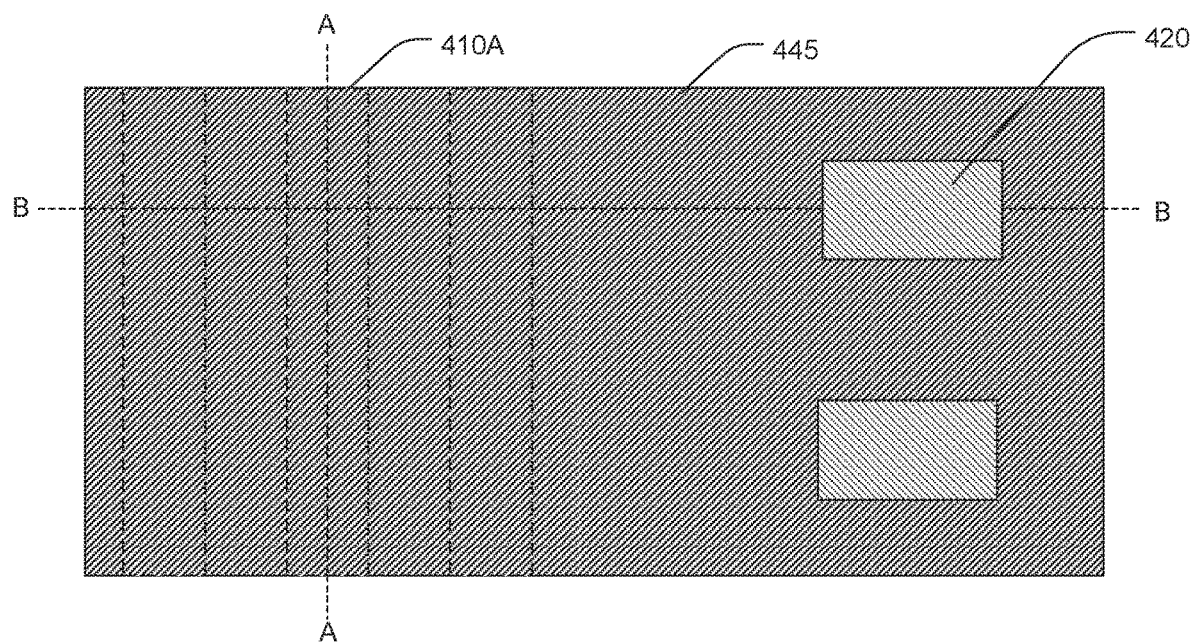
FIG. 4G illustrates a top view of a memory device at one stage of manufacturing, in accordance with an example embodiment.
Figure 4H:
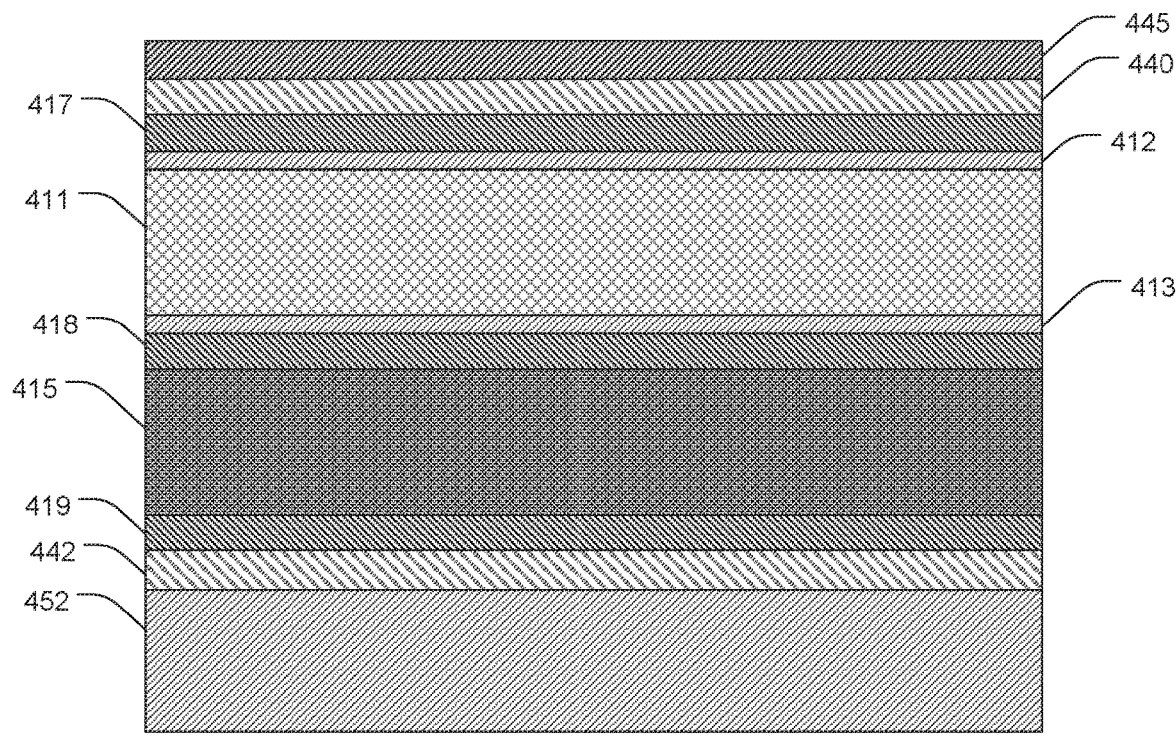
FIG. 4H illustrates a cross-sectional view of the memory device of FIG. 4G along line A-A.
Figure 4I:
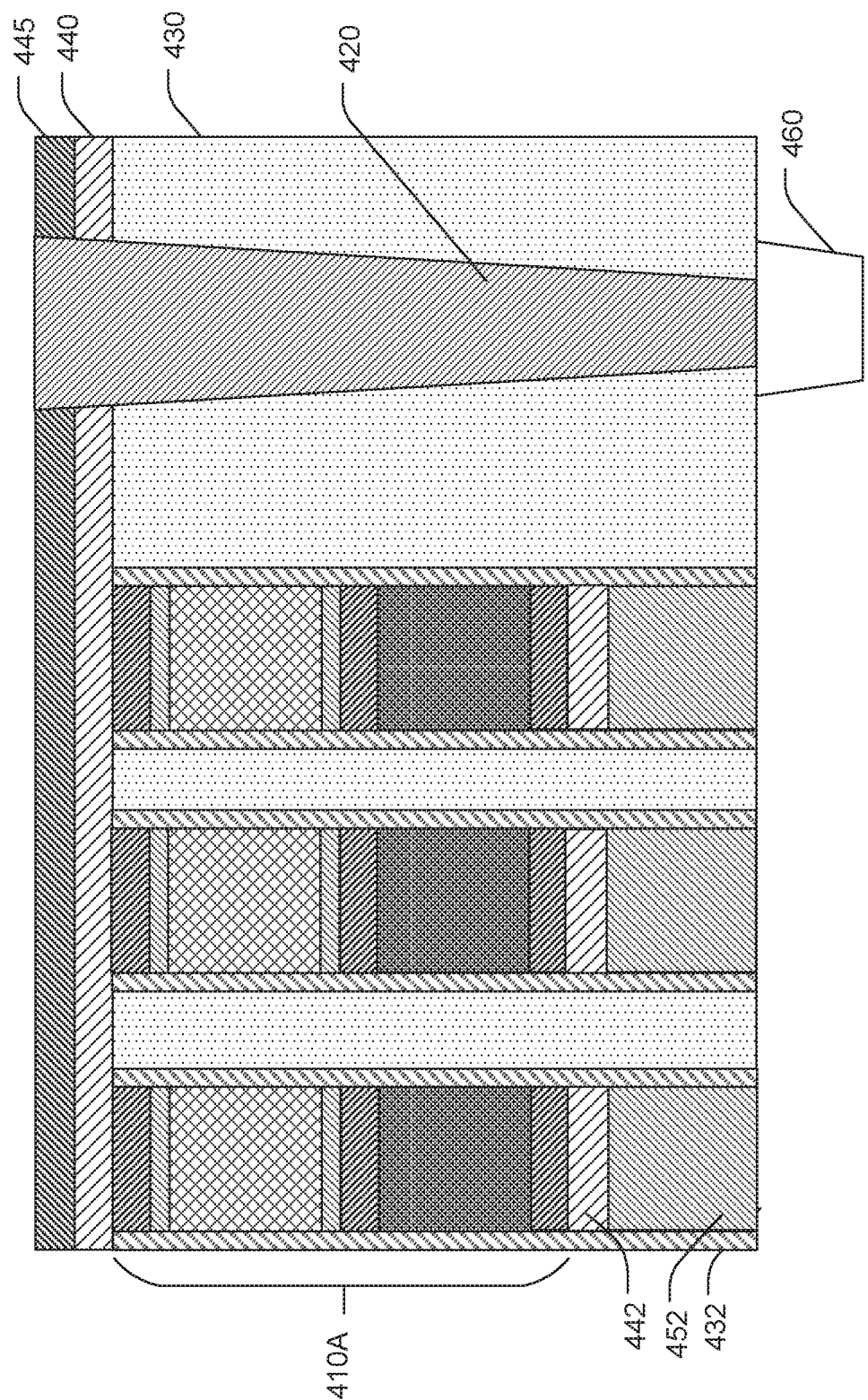
FIG. 4I illustrates a cross-sectional view of the memory device of FIG. 4G along line B-B.

As illustrated in FIGS. 4G-4I, the trenches 422 can be filled in with conductive material to form vias 420 in direct contact with individual electrical contacts or interconnects 460. Vias 420 can be bordered by dielectric material 430, the metal ceramic composite material layer 440, and the barrier layer 445. However, the upper or top surface of vias 420 can remain exposed. The vias can be formed using any suitable deposition method or other suitable method. Non-limiting examples can include CVD, PVD, the like, or a combination thereof.

FIGS. 5A-5C illustrate one example of a manufacturing process subsequent to FIGS. 4G-4I. More specifically, FIGS. 5A-5C illustrate the memory device after the second cut. In further detail, a conductive layer 450 can be formed on barrier layer 445 and upper surfaces of the plurality of vias 420. Thus, a lower or bottom surface of conductive material layer 450 can be in direct contact with an upper or top surface of the plurality of vias 420. The precursor memory cells 410A can be cut or etched to form a plurality of rows of memory cells 410. As such, the metal ceramic composite material layer 440, the barrier layer 445, and the conductive layer 450 are also cut or etched to form individual layer segments extending along individual rows of memory cells 410.

Dielectric material 430 can be filled in to separate individual rows of memory cells 410 from one another. It is noted that the dielectric material separating individual rows of memory cells and the dielectric material separating individual columns of memory cells can be the same or different, as desired. Thus, FIGS. 5A-5C illustrate an array of memory cells 410 arranged along individual columns (e.g. in the direction of line A-A) and rows (e.g. in the direction of line B-B). Further, individual memory cells 410 are positioned between individual conductive layers 450 and second conductive layers 452 to form individually addressable memory cells 410. In some specific examples, the conductive layers 450 and the second conductive layers 452 can be oriented substantially transverse or perpendicular to one another. In other examples, the conductive layers 450 and the second conductive layers 452 can cross one another, but not at right angles.

It is noted that where barrier layers 445 are included in the final memory device, the barrier layers 445 can be formed of a material (e.g. conductive or semi-conductive materials) that will not adversely affect the overall performance of individual memory cells 410. However, in some examples, as illustrated in FIGS. 6A-6F, the barrier layer can be removed from the memory device.

For example, as illustrated in FIGS. 6A-6C, barrier layer 445 can be removed using a process that is selective for the barrier layer 445 without significantly affecting the vias 420. In some specific examples, the barrier layer 445 can be removed via chemical mechanical polishing (CMP). As can be seen in FIG. 6C, vias 420 can remain protruding from a top surface of the memory device or from a top surface of the metal ceramic composite material layer 440.

As illustrated in FIGS. 6D-6F, the same general process as described with respect to FIGS. 5A-5C can then be followed from this point. Thus, FIGS. 6D-6F illustrate the memory device after a second cut. More specifically, a conductive layer 450 can be formed on metal ceramic composite material layer 440 and upper surfaces of the plurality of vias 420. In this particular example, the bottom surface of the conductive material layer 450 can be non-planar due to the protruding vias 420. Thus, elevated or indented portions of the lower or bottom surface of conductive material layer 450 can be in direct contact with an upper or top surface of vias 420. Precursor memory cells 410A can be cut or etched to form a plurality of rows of individual memory cells 410. As such, the metal ceramic composite material layer 440 and the conductive layer 450 are also cut or etched to form individual layer segments extending along individual rows of memory cells 410.

Dielectric material 430 can be filled in to separate individual rows of memory cells 410 from one another. It is noted that the dielectric material separating individual rows of memory cells and the dielectric material separating individual columns of memory cells can be the same or different, as desired. Thus, FIGS. 6D-6F illustrate an array of memory cells 410 arranged along individual columns (i.e. in the direction of line A-A) and rows (i.e. in the direction of line B-B). Further, individual memory cells 410 are positioned between individual conductive layers 450 and second conductive layers 452 to form individually addressable memory cells. In some specific examples, the conductive layers 450 and the second conductive layers 452 can be oriented substantially transverse or perpendicular to one another. In other examples, the conductive layers 450 and the second conductive layers 452 can cross one another, but not at right angles.

EXAMPLES

In one example, a memory structure can include a memory cell, a via, a dielectric material separating the memory cell from the via, a metal ceramic composite material layer on the memory cell and the dielectric material, and a conductive layer on the metal ceramic composite material layer and the via, wherein the conductive layer is in direct contact with an upper surface of the via.

In one example of a memory structure, the memory cell comprises a memory layer selected from a phase change memory (PCM) layer and self-selecting memory (SSM) memory layer.

In one example of a memory structure, the memory cell is a self-selecting memory (SSM) cell.

In one example, the SSM cell comprises a chalcogenide material.

In one example of a memory structure, the memory cell is a phase change memory (PCM) cell.

In one example of a memory structure, the PCM cell comprises a PCM material.

In one example of a memory structure, the PCM material comprises germanium, antimony, tellurium, silicon, nickel, gallium, arsenic, silver, tin, gold, lead, bismuth, indium, selenium, oxygen, sulphur, nitrogen, carbon, or a combination thereof.

In one example of a memory structure, the PCM cell comprises a lamina layer in direct contact with the PCM material.

In one example of a memory structure, the lamina layer comprises a refractory metal, a refractory metal nitride, a refractory metal silicide, a refractory metal carbide, a refractory metal boride, or a combination thereof.

In one example of a memory structure, the PCM cell comprises an electrode layer.

In one example of a memory structure, the electrode layer comprises amorphous carbon, carbon nitride, a refractory metal, a refractory metal nitride, a refractory metal silicide, a refractory metal carbide, a refractory metal boride, or a combination thereof.

In one example of a memory structure, the electrode layer has a thickness of from 5 nanometers (nm) to 100 nm.

In one example of a memory structure, the electrode layer has a thickness of from 5 nm to 30 nm.

In one example of a memory structure, the PCM cell comprises a phase change memory material, a select device layer, and an electrode layer.

In one example of a memory structure, the electrode layer is between the phase change memory material and the metal ceramic composite material layer, between the phase change material and the select device layer, between the select device layer and a second metal ceramic composite material layer, or a combination thereof.

In one example of a memory structure, the second metal ceramic composite material layer is on a second conductive layer.

In one example of a memory structure, the via is oriented substantially parallel to the memory cell.

In one example of a memory structure, the via comprises tungsten (W), tungsten nitride (WN), nickel (Ni), tantalum nitride (TaN), platinum (Pt), gold (Au), titanium (Ti), titanium nitride (TiN), titanium silicon nitride (TiSiN), titanium aluminum nitride (TiAlN), molybdenum nitride (MoN), or a combination thereof.

In one example of a memory structure, the via comprises a material that is distinct from the conductive layer.

In one example of a memory structure, the dielectric material comprises silicon oxide, silicon nitride, silicon oxy-carbide, spin-on-glass, organic polymer, organic/inorganic co-polymer, or other combination thereof.

In one example of a memory structure, the memory structure can further include a second dielectric material disposed in direct contact with the memory cell.

In one example of a memory structure, the second dielectric material comprises silicon oxide, silicon nitride, silicon oxy-carbide, spin-on-glass, organic polymer, organic/inorganic co-polymer, or other combination thereof.

In one example of a memory structure, the metal ceramic composite material layer comprises tungsten silicon nitride, tantalum silicon nitride, niobium silicon nitride, molybdenum silicon nitride, titanium silicon nitride, carbon nitride, tungsten carbon nitride, doped alpha silicon, doped alpha germanium, or a combination thereof.

In one example of a memory structure, the metal ceramic composite material layer has a thickness of from 1 nm to 50 nm.

In one example of a memory structure, the metal ceramic composite material layer has a thickness of from 1 nm to 30 nm.

In one example of a memory structure, the metal ceramic composite material layer is in direct contact with the conductive layer.

In one example of a memory structure, the via extends beyond an upper surface of the metal ceramic composite material layer into the conductive layer to a distance not greater than 30 nm.

In one example of a memory structure, the memory structure can further include a barrier layer disposed between the metal ceramic composite material layer and the conductive layer.

In one example of a memory structure, the barrier layer comprises amorphous carbon, carbon nitride, tungsten carbon nitride, tungsten nitride, titanium, titanium nitride, aluminum, tantalum nitride, aluminum tantalum nitride, molybdenum, ruthenium, silicon carbide, or a combination thereof.

In one example of a memory structure, the barrier layer has a thickness of from 5 nm to 100 nm.

In one example of a memory structure, the barrier layer has a thickness of from 5 nm to 50 nm.

In one example of a memory structure, an upper surface of the barrier layer is planar with the upper surface of the via.

In one example of a memory structure, the conductive layer comprises tungsten (W), tungsten nitride (WN), nickel (Ni), aluminum (Al), tantalum nitride (TaN), platinum (Pt), gold (Au), titanium nitride (TiN), titanium silicon nitride (TiSiN), titanium aluminum nitride (TiAlN), molybdenum nitride (MoN), or a combination thereof.

In one example, a memory device can include an array of memory cells arranged in columns and rows, a plurality of vias aligned with individual rows of memory cells, dielectric material separating individual memory cells from one another and from the plurality of vias, individual metal ceramic composite material layers on separate rows of memory cells and corresponding dielectric material, and individual conductive layers on individual metal ceramic composite material layers and in direct contact with individual upper surfaces of corresponding vias.

In one example of a memory device, individual memory cells are phase change memory (PCM) cells.

In one example of a memory device, individual PCM cells comprise a PCM material.

In one example of a memory device, the PCM material comprises germanium, antimony, tellurium, silicon, nickel, gallium, arsenic, silver, tin, gold, lead, bismuth, indium, selenium, oxygen, sulphur, nitrogen, carbon, or a combination thereof.

In one example of a memory device, individual PCM cells further comprise a lamina layer in direct contact with the PCM material.

In one example of a memory device, the lamina layer comprises a refractory metal, a refractory metal nitride, a refractory metal silicide, a refractory metal carbide, a refractory metal boride, or a combination thereof.

In one example of a memory device, individual PCM cells comprise an electrode layer.

In one example of a memory device, the electrode layer comprises amorphous carbon, carbon nitride, a refractory metal, a refractory metal nitride, a refractory metal silicide, a refractory metal carbide, a refractory metal boride, or a combination thereof.

In one example of a memory device, the electrode layer has a thickness of from 5 nm to 100 nm.

In one example of a memory device, individual PCM cells comprise a phase change material, a select device layer, and an electrode layer.

In one example of a memory device, the electrode layer is between the phase change material and an individual metal ceramic composite material layer, between the phase change material and the select device layer, between the select device layer and a second metal ceramic composite material layer, or a combination thereof.

In one example of a memory device, the second metal ceramic composite material layer is on a second conductive layer.

In one example of a memory device, individual vias are oriented substantially parallel to the array of memory cells.

In one example of a memory device, individual vias comprise tungsten (W), tungsten nitride (WN), nickel (Ni), tantalum nitride (TaN), platinum (Pt), gold (Au), titanium (Ti), titanium nitride (TiN), titanium silicon nitride (TiSiN), titanium aluminum nitride (TiAlN), molybdenum nitride (MoN), or a combination thereof.

In one example of a memory device, individual vias comprise a material that is distinct from the individual conductive layers.

In one example of a memory device, the dielectric material comprises silicon oxide, silicon nitride, silicon oxy-carbide, spin-on-glass, organic polymer, organic/inorganic co-polymer, or other combination thereof.

In one example of a memory device, the memory device can further include a second dielectric material between individual memory cells.

In one example of a memory device, the second dielectric material comprises silicon oxide, silicon nitride, silicon oxy-carbide, spin-on-glass, organic polymer, organic/inorganic co-polymer, or other combination thereof.

In one example of a memory device, individual metal ceramic composite material layers comprise tungsten silicon nitride, tantalum silicon nitride, niobium silicon nitride, molybdenum silicon nitride, titanium silicon nitride, carbon nitride, tungsten carbon nitride, doped alpha silicon, doped alpha germanium, or a combination thereof.

In one example of a memory device, individual metal ceramic composite material layers have a thickness of from 1 nm to 50 nm.

In one example of a memory device, individual metal ceramic composite material layers are in direct contact with individual conductive layers.

In one example of a memory device, individual vias extend beyond individual metal ceramic composite material layers into individual conductive layers to a distance not greater than 100 nm.

In one example of a memory device, the memory device can further include individual barrier layers disposed between individual metal ceramic composite material layers and individual conductive layers.

In one example of a memory device, individual barrier layers comprise amorphous carbon, carbon nitride, tungsten carbon nitride, tungsten nitride, titanium, titanium nitride, aluminum, tantalum nitride, aluminum tantalum nitride, molybdenum, ruthenium, silicon carbide, or a combination thereof.

In one example of a memory device, individual barrier layers have a thickness of from 5 nm to 100 nm.

In one example of a memory device, individual conductive layers comprise tungsten (W), tungsten nitride (WN), nickel (Ni), aluminum (Al), tantalum nitride (TaN), platinum (Pt), gold (Au), titanium nitride (TiN), titanium silicon nitride (TiSiN), titanium aluminum nitride (TiAlN), molybdenum nitride (MoN), or a combination thereof.

In one example, a computing system can include a motherboard and a memory device as described herein operably coupled to the motherboard.

In one example of a computing system, the computing system includes a desktop computer, a laptop computer, a tablet, a smartphone, a wearable device, a server, or a combination thereof.

In one example of a computing system, the computing system further includes a processor, a memory device, a heat sink, a radio, a slot, a port, or a combination thereof operably coupled to the motherboard.

In one example, a method of manufacturing a memory device includes forming an array of memory cells arranged in columns and rows, positioning dielectric material to separate individual memory cells from one another, forming a plurality of vias within the dielectric material wherein individual vias are aligned with individual rows of memory cells, forming individual metal ceramic composite material layers on separate rows of memory cells and corresponding dielectric material, and forming individual conductive layers on individual metal ceramic composite material layers and in direct contact with individual upper surfaces of corresponding vias.

In one example of a method of manufacturing, forming the array of memory cells comprises forming an array of phase change memory (PCM) cells.

In one example of a method of manufacturing, forming individual PCM cells comprises forming a phase change material, a select device layer, and an electrode layer.

In one example of a method of manufacturing, the electrode layer is formed between the phase change material and the metal ceramic composite material layer, between the phase change material and the select device layer, between the select device layer and a second metal ceramic composite material layer, or a combination thereof.

In one example of a method of manufacturing, the second metal ceramic composite material layer is formed on a second conductive layer.

In one example of a method of manufacturing, the method can further include positioning a second dielectric material to separate individual memory cells.

In one example of a method of manufacturing, a portion of individual vias are formed within metal ceramic composite material positioned on the dielectric material.

In one example of a method of manufacturing, the method can further include forming individual barrier layers on individual metal ceramic composite material layers.

In one example of a method of manufacturing, a portion of individual vias are formed within barrier layer material positioned on metal ceramic composite material.

In one example of a method of manufacturing, the barrier layer material is a sacrificial material that is removed after formation of the plurality of vias.

In one example of a method of manufacturing, the sacrificial material is removed by chemical mechanical polishing (CMP).

In one example of a method of manufacturing, the via extends beyond the metal ceramic composite material layer into the conductive layer to a distance not greater than 100 nm.

What is claimed is:

1. A memory structure, comprising:
   a memory cell;
   a via;
   a dielectric material separating the memory cell from the via;
   a metal ceramic composite material layer on the memory cell and the dielectric material; and
   a conductive layer on the metal ceramic composite material layer and the via, wherein the conductive layer is in direct contact with an upper surface of the via;
   wherein either:
      the via extends beyond an upper surface of the metal ceramic composite material layer into the conductive layer to a distance not greater than 100 nm; or
      the memory structure further comprises a barrier layer disposed between the metal ceramic composite material layer and the conductive layer, said barrier layer having an upper surface that is planar with an upper surface of the via.

2. The memory structure of claim 1, wherein the memory cell is a phase change memory (PCM) cell.

3. The memory structure of claim 2, wherein the PCM cell comprises a phase change material, a select device layer, and an electrode layer.

4. The memory structure of claim 3, wherein the electrode layer is between the phase change memory material and the metal ceramic composite material layer, between the phase change material and the select device layer, between the select device layer and a second metal ceramic composite material layer, or a combination thereof.

5. The memory structure of claim 4, wherein the second metal ceramic composite material layer is on a second conductive layer.

6. The memory structure of claim 1, wherein the via is oriented substantially parallel to the memory cell.

7. The memory structure of claim 1, wherein the via comprises a material that is distinct from the conductive layer.

8. The memory structure of claim 1, further comprising a second dielectric material disposed in direct contact with the memory cell.

9. The memory structure of claim 1, wherein the metal ceramic composite material layer has a thickness of from 1 nm to 50 nm.

10. The memory structure of claim 1, wherein the metal ceramic composite material layer is in direct contact with the conductive layer.

11. The memory structure of claim 1, wherein the barrier layer has a thickness of from 5 nm to 100 nm.

12. A method of manufacturing a memory device, comprising:
   forming an array of memory cells arranged in columns and rows;
   positioning dielectric material to separate individual memory cells from one another;
   forming a plurality of vias within the dielectric material, wherein individual vias are aligned with individual rows of memory cells;
   forming individual metal ceramic composite material layers on separate rows of memory cells and corresponding dielectric material; and
   forming individual conductive layers on individual metal ceramic composite material layers and in direct contact with individual upper surfaces of corresponding vias;
   wherein either:
      a portion of individual vias are formed within the metal ceramic composite material positioned on the dielectric material; or
      the method further comprises forming individual barrier layer materials on individual metal ceramic composite material layers, with a portion of the individual vias formed within the barrier layer material.

13. The method of claim 12, wherein forming the array of memory cells comprises forming an array of phase change memory (PCM) cells.

14. The method of claim 13, wherein forming individual PCM cells comprises forming a phase change material, a select device layer, and an electrode layer.

15. The method of claim 14, wherein the electrode layer is formed between the phase change material and the metal ceramic composite material layer, between the phase change material and the select device layer, between the select device layer and a second metal ceramic composite material layer, or a combination thereof.

16. The method of claim 15, wherein the second metal ceramic composite material layer is formed on a second conductive layer.

17. The method of claim 12, further comprising positioning a second dielectric material to separate individual memory cells.

18. The method of claim 12, wherein the barrier layer materials are a sacrificial material that is removed after formation of the plurality of vias.

19. The method of claim 18, wherein the sacrificial material is removed by chemical mechanical polishing (CMP).

20. The method of claim 18, wherein the via extends beyond the metal ceramic composite material layer into the conductive layer to a distance not greater than 100 nm.

* * * * *